US010847641B2

(12) United States Patent
Abe et al.

(10) Patent No.: US 10,847,641 B2
(45) Date of Patent: Nov. 24, 2020

(54) SEMICONDUCTOR DEVICE HAVING SEMICONDUCTOR REGIONS OF DIFFERENT CONDUCTIVITY TYPES PROVIDED AT A PREDETERMINED INTERVAL ALONG A FIRST DIRECTION

(71) Applicant: FUJI ELECTRIC CO., LTD., Kawasaki (JP)

(72) Inventors: Hitoshi Abe, Matsumoto (JP); Takeshi Fujii, Matsumoto (JP); Tomoyuki Obata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 40 days.

(21) Appl. No.: 16/171,680

(22) Filed: Oct. 26, 2018

(65) Prior Publication Data

US 2019/0067463 A1 Feb. 28, 2019

Related U.S. Application Data

(63) Continuation of application No. PCT/JP2017/041001, filed on Nov. 14, 2017.

(30) Foreign Application Priority Data

Nov. 17, 2016 (JP) .................. 2016-223943

(51) Int. Cl.
*H01L 29/739* (2006.01)
*H01L 29/40* (2006.01)
*H01L 29/10* (2006.01)
*H01L 29/06* (2006.01)
*H01L 29/423* (2006.01)
*H01L 29/66* (2006.01)
*H01L 29/861* (2006.01)

(52) U.S. Cl.
CPC ...... *H01L 29/7397* (2013.01); *H01L 29/0696* (2013.01); *H01L 29/1095* (2013.01);
(Continued)

(58) Field of Classification Search
CPC ............ H01L 29/7397; H01L 29/0696; H01L 29/1095; H01L 29/407; H01L 29/4236;
(Continued)

(56) References Cited

U.S. PATENT DOCUMENTS 6,351,018 B1 2/2002 Sapp
2008/0012050 A1 1/2008 Aoki et al.
(Continued)

FOREIGN PATENT DOCUMENTS

JP 200216252 A 1/2002
JP 2002538602 A 11/2002
(Continued)

OTHER PUBLICATIONS

International Search Report dated Jan. 16, 2018 in corresponding International Patent Application No. PCT/JP2017/041001.
(Continued)

*Primary Examiner* — Tucker J Wright

(57) ABSTRACT

Among trenches disposed in a striped-shape parallel to a front surface of a semiconductor substrate, a gate electrode at a gate potential is provided in a gate trench, via a gate insulating film; and in a dummy trench, a dummy gate electrode at an emitter electric potential is provided, via a dummy gate insulating film. Among mesa regions, in a first mesa region functioning as a MOS gate, a first p-type base region is provided in a surface region overall. In a second mesa region not functioning as a MOS gate, a second p-type base region is selectively provided at a predetermined interval, along a first direction. At least one of the trenches on each side of a mesa region is a gate trench and at at least one side wall of the gate trench, a MOS gate is driven. As a result, the ON voltage may be reduced.

20 Claims, 34 Drawing Sheets

(52) U.S. Cl.
CPC ........ *H01L 29/407* (2013.01); *H01L 29/4236* (2013.01); *H01L 29/66348* (2013.01); *H01L 29/739* (2013.01); *H01L 29/8613* (2013.01)

(58) Field of Classification Search
CPC ............. H01L 29/66348; H01L 29/739; H01L 29/8613
See application file for complete search history.

(56) References Cited

U.S. PATENT DOCUMENTS

| | | |
|---|---|---|
| 2009/0020852 A1 | 1/2009 | Harada |
| 2013/0037853 A1* | 2/2013 | Onozawa ............ H01L 29/0839 257/139 |
| 2014/0070270 A1 | 3/2014 | Yoshida et al. |

FOREIGN PATENT DOCUMENTS

| | | |
|---|---|---|
| JP | 2008021930 A | 1/2008 |
| JP | 2008205500 A | 9/2008 |
| JP | 200926797 A | 2/2009 |
| JP | 2013183143 A | 9/2013 |
| JP | 201475582 A | 4/2014 |
| JP | 2014112625 A | 6/2014 |
| WO | 2011111500 A1 | 9/2011 |

OTHER PUBLICATIONS

Written Opinion of the International Searching Authority dated Jan. 16, 2018 in corresponding International Patent Application No. PCT/JP2017/041001.

\* cited by examiner

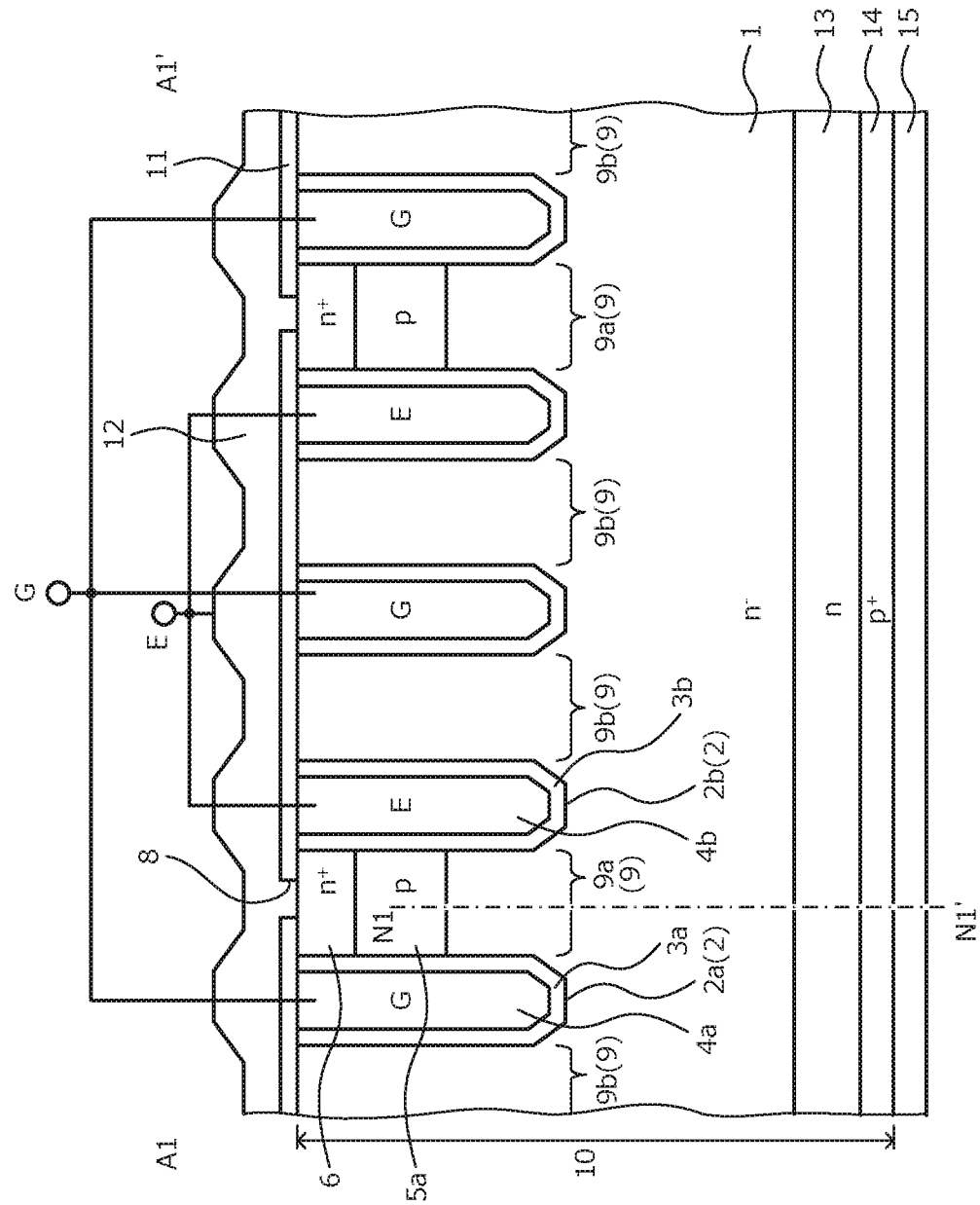

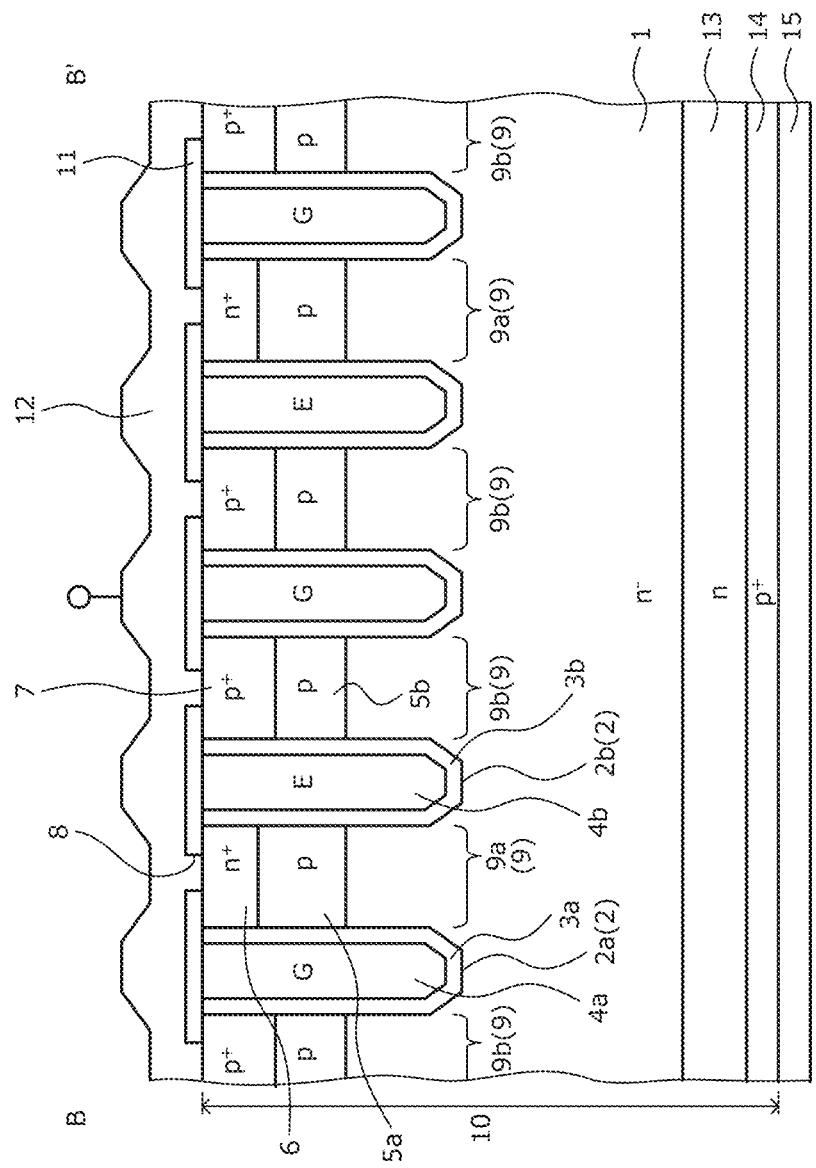

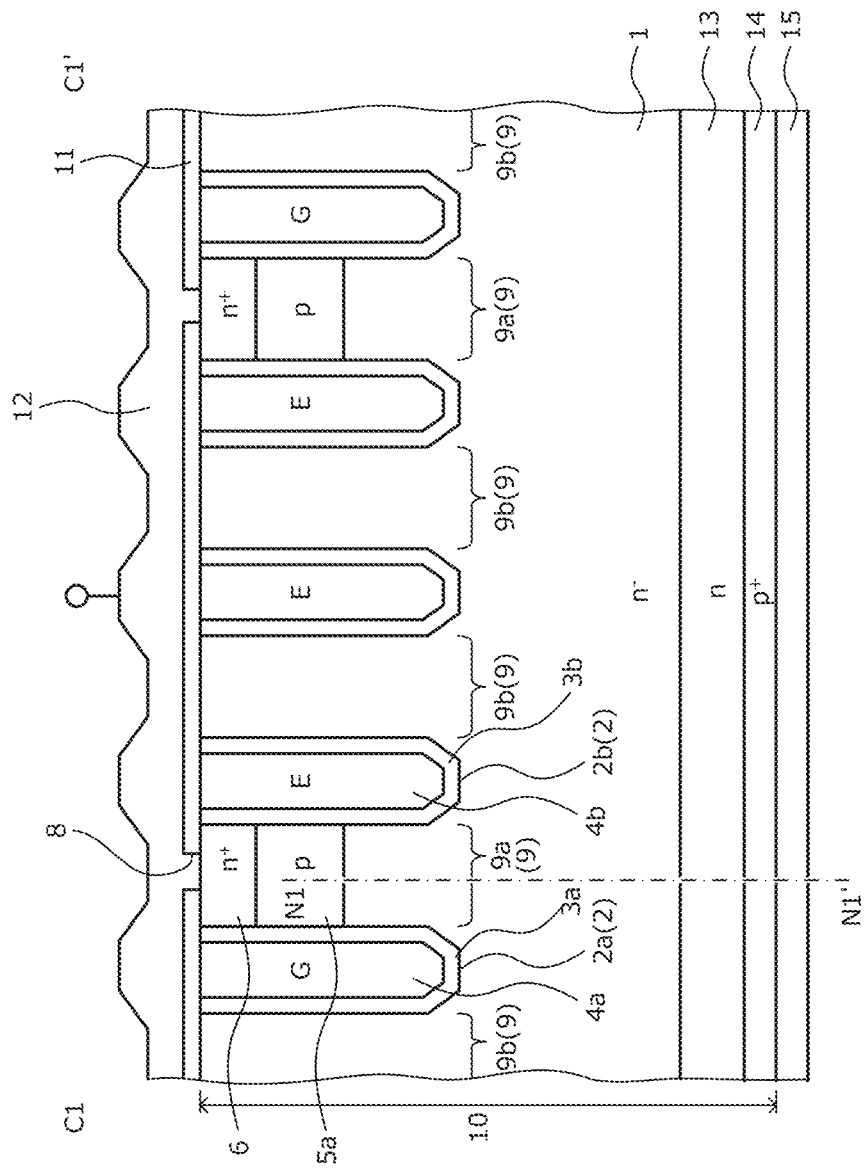

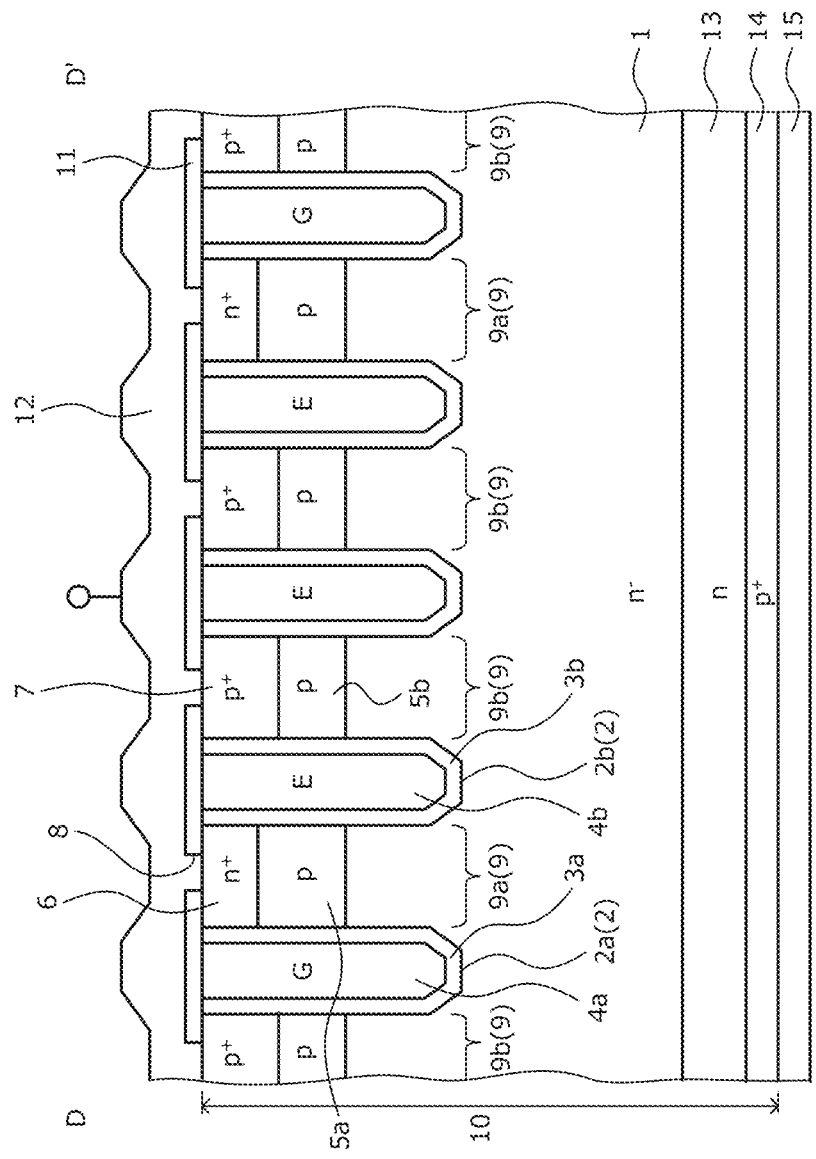

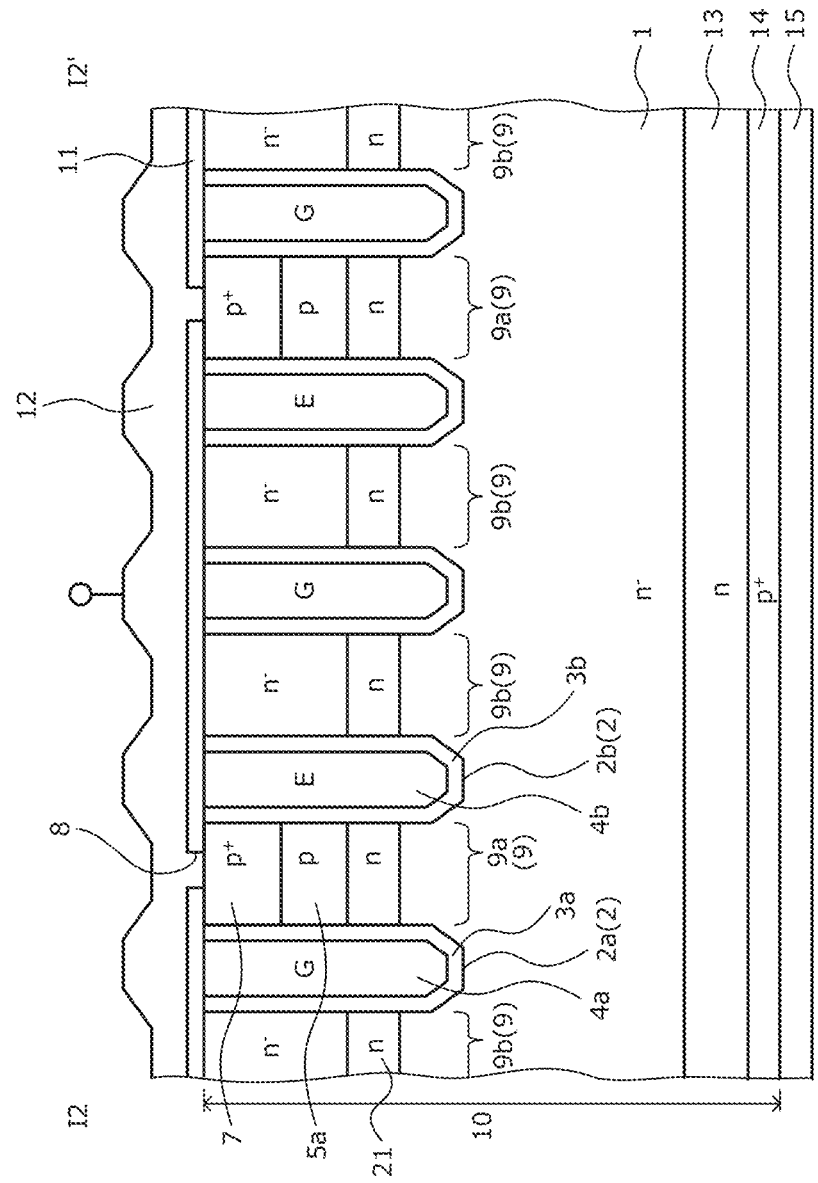

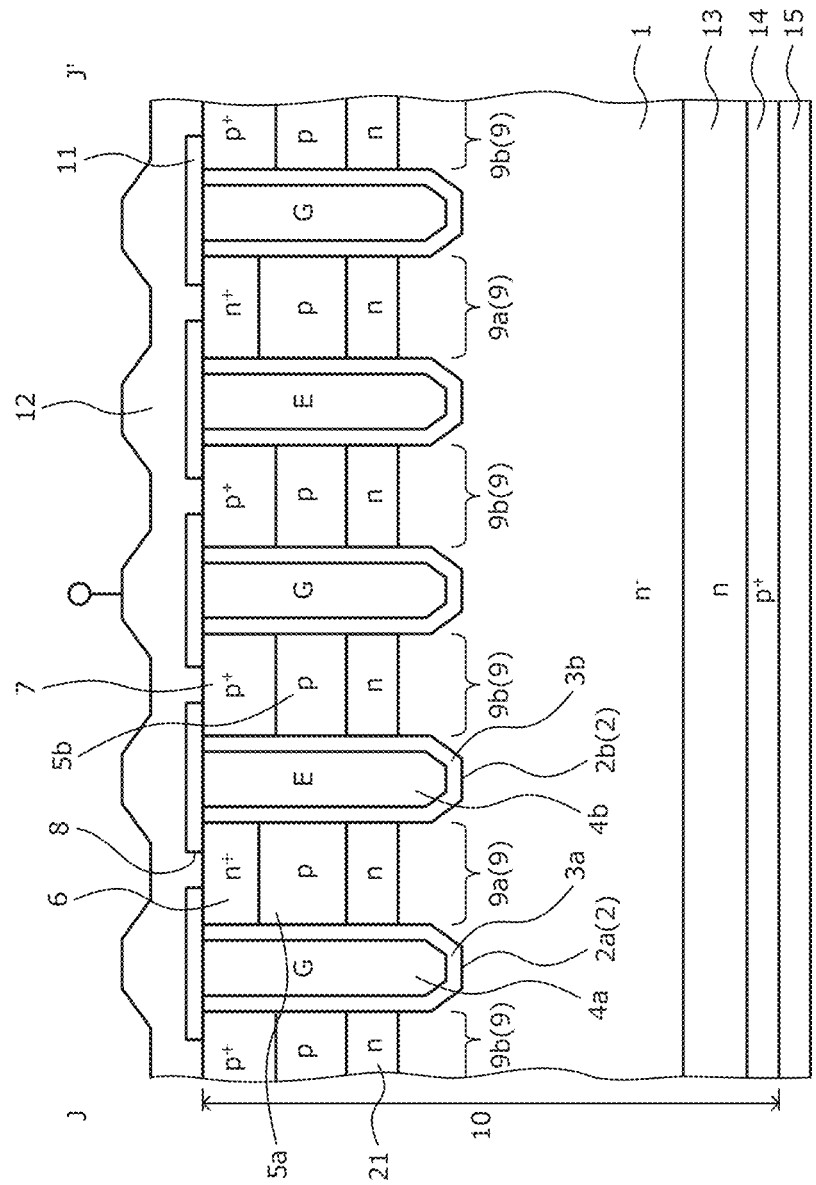

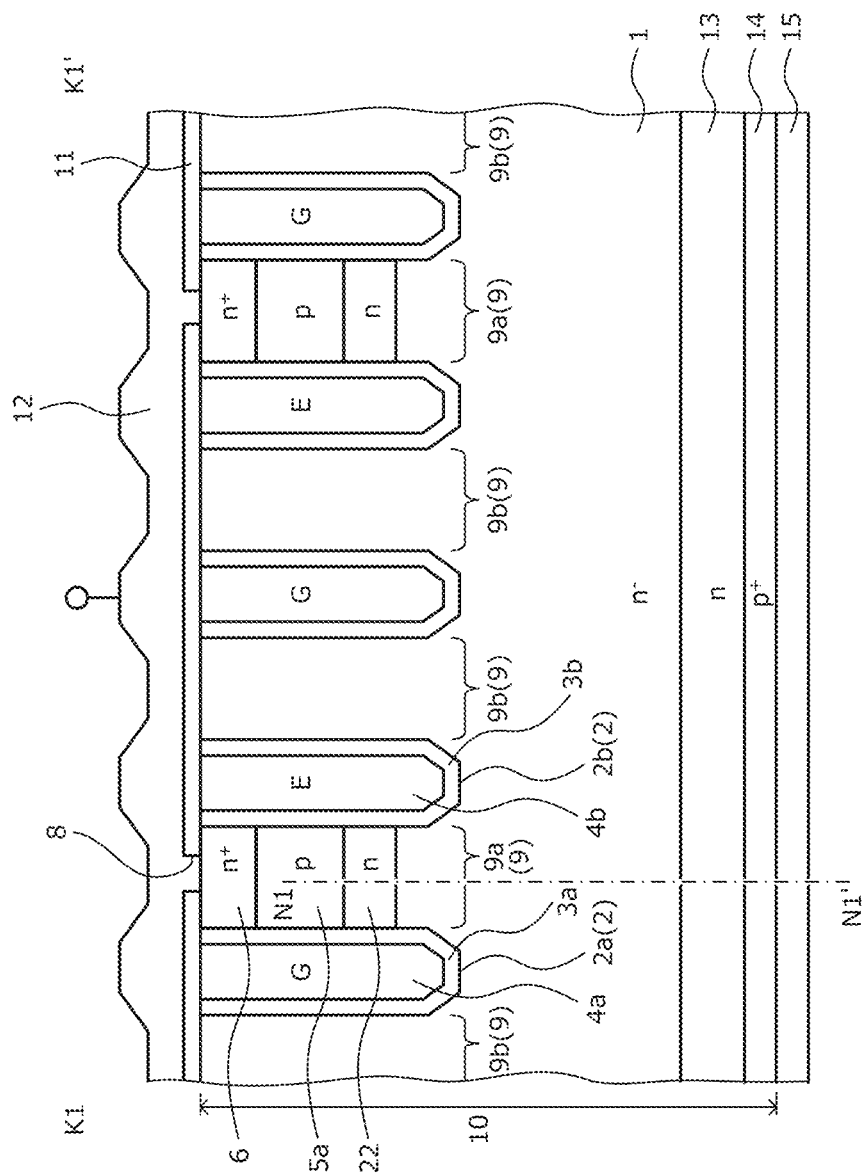

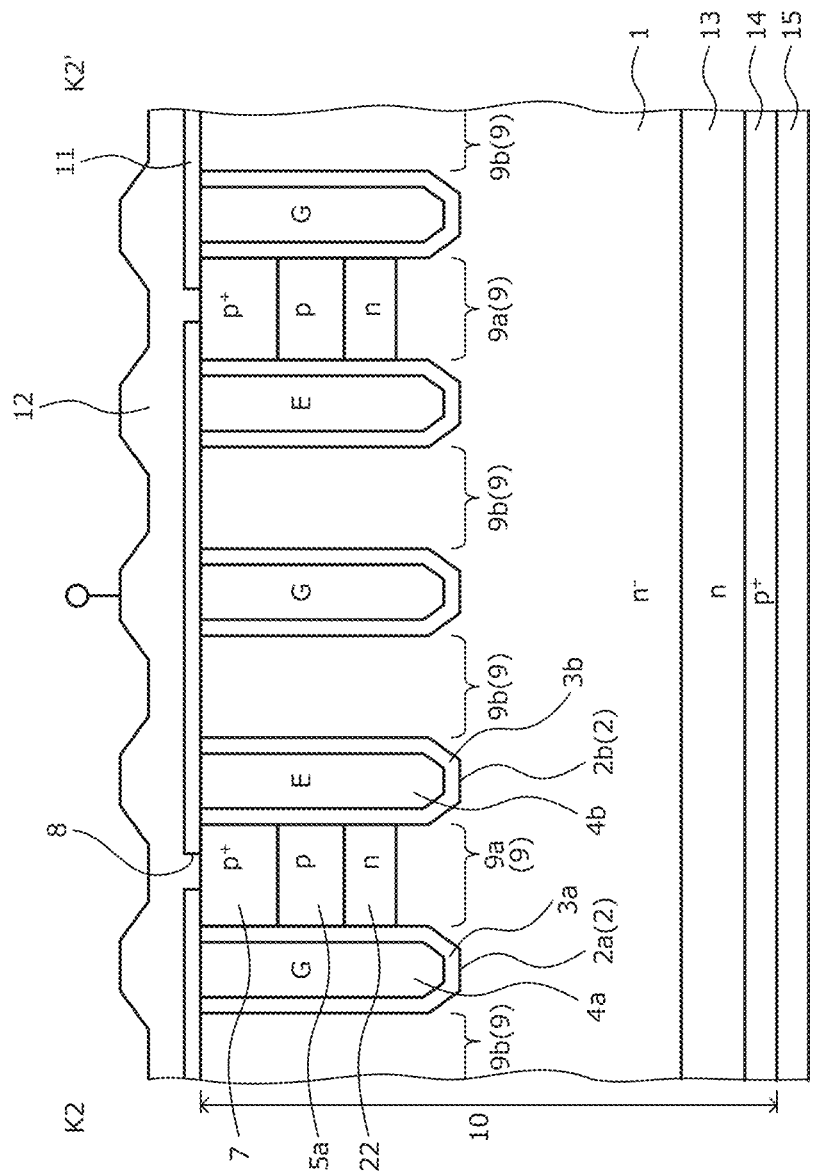

SEMICONDUCTOR DEVICE HAVING SEMICONDUCTOR REGIONS OF DIFFERENT CONDUCTIVITY TYPES PROVIDED AT A PREDETERMINED INTERVAL ALONG A FIRST DIRECTION

CROSS REFERENCE TO RELATED APPLICATIONS

This is a continuation application of International Application PCT/JP2017/041001 filed on Nov. 14, 2017 which claims priority from a Japanese Patent Application No. 2016-223943 filed on Nov. 17, 2016, the contents of which are incorporated herein by reference.

BACKGROUND

1. Field

Embodiments of the invention relate to a semiconductor device.

2. Description of Related Art

Conventionally, as an insulated gate bipolar transistor (IGBT) having a trench gate structure, device is commonly known that includes a trench (hereinafter, gate trench) in which a MOS gate structure that contributes to gate control is formed, and a trench (hereinafter, dummy trench) in which a dummy MOS gate structure that does not contribute to gate control is formed. A structure of a conventional trench gate IGBT will be described.

FIG. 19 is a perspective view of a structure of the conventional trench gate IGBT. FIG. 20 is a cross-sectional view at cutting line AA-AA' in FIG. 19. FIG. 21 is a cross-sectional view at cutting line BB-BB' in FIG. 19. In FIG. 19, to clearly depict a planar layout of a region (mesa region) 109 sandwiched between adjacent trenches 102, an interlayer insulating film 111 and an emitter electrode 112 are not depicted. A planar layout is a planar shape and arrangement configuration of constituent parts as viewed from a front surface side of a semiconductor substrate 110.

As depicted in FIGS. 19, 20, and 21, at the front surface side of the semiconductor substrate 110, plural trenches 102 are provided. The plural trenches 102 are disposed in a striped planar layout extending parallel to the front surface of the semiconductor substrate 110. Of the plural trenches 102, some of the trenches 102 are gate trenches 102a while the other trenches 102 are dummy trenches 102b. The gate trenches 102a and the dummy trenches 102b, for example, are disposed to alternate each other.

In the gate trenches 102a, a gate electrode 104a is provided via a gate insulating film 103a. In the dummy trenches 102b, an electrode (hereinafter, a dummy gate electrode) 104b is provided via an insulating film (hereinafter, dummy gate insulating film) 103b. The dummy gate electrode 104b is electrically connected with the gate electrode 104a and, for example, is electrically connected with emitter electric potential. In all of the mesa regions 109 (regions sandwiched between the trenches 102), a p-type base region 105 is provided.

In the p-type base region 105, an $n^+$-type emitter region 106 and a $p^+$-type contact region 107 are selectively provided. The $n^+$-type emitter region 106 is disposed in a planar layout extending in a striped shape along a direction (hereinafter, a second direction) Y orthogonal to a direction (hereinafter, a first direction) X along which the trenches 102 extend in a striped shape. The $n^+$-type emitter region 106, between adjacent gate trenches 102a, is continuous with adjacent mesa regions 109 sandwiching a dummy trench 102b and extend in the second direction Y.

A part of the $n^+$-type emitter regions 106 and the $p^+$-type contact regions 107 are exposed in contact holes 108 (part indicated by broken lines) for passage of an electrical contact (contact) with the emitter electrode 112. In FIG. 19, the $n^+$-type emitter region 106 and the p-type base region 105 (including the $p^+$-type contact region 107) are indicated by different hatching. Reference numerals 101, 113, 114, and 115 are an $n^-$-type drift layer, an n-type buffer layer, a $p^+$-type contact layer, and a contact electrode, respectively.

As a trench gate IGBT having such a dummy gate electrode, a device has been proposed in which a width of an emitter region is optimized and a resistance value of a base region is set to a predetermined value, whereby at the time of turn OFF, minority carriers in a drift region are discharged at high speed and a reverse bias safe operation area (RB-SOA) is established (for example, refer to Japanese Laid-Open Patent Publication No. 2009-026797 (paragraphs 0053, 0058)). Further, in Japanese Laid-Open Patent Publication No. 2009-026797, the emitter region is formed in a striped shape extending along a direction orthogonal to the trenches, whereby variation of saturation current is suppressed.

Further, as another trench gate IGBT having a dummy gate electrode, a device has been proposed in which in a mesa region between adjacent gate trenches, an emitter region and a base region are disposed to alternate repeatedly along a direction along which the gate trenches extend in a striped shape (for example, refer to Japanese Laid-Open Patent Publication No. 2008-205500 (paragraph 0031)). In Japanese Laid-Open Patent Publication No. 2008-205500, in mesa regions between the gate trench and a dummy trench and the mesa regions between the dummy trenches, only the base region is disposed and without disposing the emitter region, whereby an IE effect is increased and element ON resistance is reduced.

As another trench gate IGBT having a dummy gate electrode, a device has been proposed in which a base region is selectively formed between adjacent gate trenches, and between adjacent base regions along a direction in which gate trenches extend in a striped shape, a dummy trench is provided in a linear shape extending in a same direction as the direction in which the gate trenches extend in the striped shape (for example, refer to International Publication No. 2011/111500 (paragraph 0058)). In International Publication No. 2011/111500, a region in which a depletion layer spreads may be reduced by the dummy trench, whereby capacitance between a collector and a gate us reduced.

SUMMARY

According to an embodiment of the present invention, a semiconductor device includes a plurality of trenches reaching a predetermined depth from a front surface of a semiconductor substrate of a first conductivity type, the plurality of trenches being disposed in a striped layout along a first direction parallel to the front surface of the semiconductor substrate; a plurality of gate electrodes provided in the plurality of trenches, via a plurality of gate insulating films; a first gate electrode of the plurality of gate electrodes and contributing to element control; a second gate electrode of the plurality of the gate electrodes other than the first gate electrode; a first trench of the plurality of trenches and in which the first gate electrode is provided; a second trench of the plurality of trenches and in which the second gate electrode is provided; a plurality of mesa regions between adjacent trenches of the plurality of trenches; a first semiconductor region of a second conductivity type provided in a first mesa region of the plurality of mesa regions, at a depth shallower from the front surface of the semiconductor substrate than is the plurality of trenches; a second semiconductor region of the second conductivity type provided in a second mesa region of the plurality of mesa regions other than the first mesa region, the second semiconductor region being provided at a depth shallower from the front surface of the semiconductor substrate than is the plurality of trenches, at a predetermined interval along the first direction; a third semiconductor region of the first conductivity type provided in the first semiconductor region at a predetermined interval along the first direction; a fourth semiconductor region of the second conductivity type provided at a rear surface of the semiconductor substrate; a first electrode electrically connected with the first semiconductor region, the second semiconductor region, the third semiconductor region and the second gate electrode; and a second electrode electrically connected with the fourth semiconductor region. The first trench is at least one of the adjacent trenches on each side of the first mesa region. The second trench is at least one of the adjacent trenches on each side of the second mesa region.

In the embodiment, the second mesa region opposes an adjacent second mesa region, across the first trench in a second direction orthogonal to the first direction.

In the embodiment, the second mesa region opposes an adjacent second mesa region, across the second trench in a second direction orthogonal to the first direction.

In the embodiment, the first mesa region is sandwiched by the first trench and an adjacent first trench.

In the embodiment, the semiconductor device according to claim 1, further includes a fifth semiconductor region of the first conductivity type provided in the first mesa region overall, at a position deeper from the front surface of the semiconductor substrate than is the first semiconductor region, the fifth semiconductor region being in contact with the first semiconductor region and having an impurity concentration higher than that of the semiconductor substrate.

In the embodiment, the fifth semiconductor region is further provided in the second mesa region overall, at a position deeper from the front surface of the semiconductor substrate than is the second semiconductor region, the fifth semiconductor region being in contact with the second semiconductor region.

In the embodiment, the fifth semiconductor region is further provided in a region opposing the second semiconductor region in a depth direction, the fifth semiconductor region being provided at a position deeper from the front surface of the semiconductor substrate than is the second semiconductor region and provided being in contact with the second semiconductor region.

In the embodiment, the third semiconductor region is further provided in the second semiconductor region. The adjacent trenches on each side of the second mesa region are the first trench and the second trench, respectively.

In the embodiment, the semiconductor device according to claim 1, further includes a third trench of the plurality of trenches and in which the second gate electrode is provided; a third mesa region of the plurality of mesa regions and between the adjacent trenches that include at least the third trench; a sixth semiconductor region of the second conductivity type provided in the third mesa region overall, at a depth shallower from the front surface of the semiconductor substrate than is the plurality of trenches; a seventh semiconductor region of the first conductivity type provided adjacent to the fourth semiconductor region along a direction parallel to the rear surface of the semiconductor substrate, the seventh semiconductor region being in contact with the fourth semiconductor region and opposing the sixth semiconductor region in a depth direction, the seventh semiconductor region having an impurity concentration higher than that of the semiconductor substrate; a first element region in which the first trench and the second trench are disposed; a second element region in which the third trench is disposed; two fourth trenches of the plurality of trenches and in which the second gate electrode is provided, the two fourth trenches being disposed in a boundary region of the first element region and the second element region; a fourth mesa region of the plurality of mesa regions and sandwiched by the two fourth trenches; an eighth semiconductor region of the second conductivity type provided in the fourth mesa region overall, at a depth shallower from the front surface of the semiconductor substrate than is the plurality of trenches; and a ninth semiconductor region of the second conductivity type provided in the eighth semiconductor region overall, at a depth shallower from the front surface of the semiconductor substrate than is the eighth semiconductor region, the ninth semiconductor region having an impurity concentration higher than that of the eighth semiconductor region. The sixth semiconductor region and the ninth semiconductor region are electrically connected with the first electrode. The seventh semiconductor region is electrically connected with the second electrode. Of the two fourth trenches, a fourth trench nearest the first element region is adjacent to the first trench, and the second mesa region is disposed between the fourth trench nearest the first element region and the first trench adjacent thereto. Of the two fourth trenches, a fourth trench nearest the second element region is adjacent to the third trench, and the third mesa region is disposed between the fourth trench nearest the second element region and the third trench adjacent thereto.

In the embodiment, a boundary of the fourth semiconductor region and the seventh semiconductor region opposes in the depth direction, the fourth trench nearest the second element region of the two fourth trenches.

In the embodiment, a distance from the boundary of the fourth semiconductor region and the seventh semiconductor region, to the third semiconductor region disposed nearest the boundary region is at least a sum of a width of the eighth semiconductor region, a width of the second mesa region in the first element region and nearest the second element region, and widths of the adjacent trenches on each side of the second mesa region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2A is a cross-sectional view at cutting line A1-A1' in FIG. 1;

FIG. 3 is a cross-sectional view at cutting line B-B' in FIG. 1;

FIG. 5A is a cross-sectional view at cutting line C1-C1' in FIG. 4;

FIG. 6 is a cross-sectional view at cutting line D-D' in FIG. 4;

FIG. 11B is a cross-sectional view at cutting line I2-I2' in FIG. 10;

FIG. 12 is a cross-sectional view at cutting line J-J' in FIG. 10;

FIG. 14A is a cross-sectional view at cutting line K1-K1' in FIG. 13;

FIG. 14B is a cross-sectional view at cutting line K2-K2' in FIG. 13;

DESCRIPTION OF EMBODIMENTS

Figure 1:
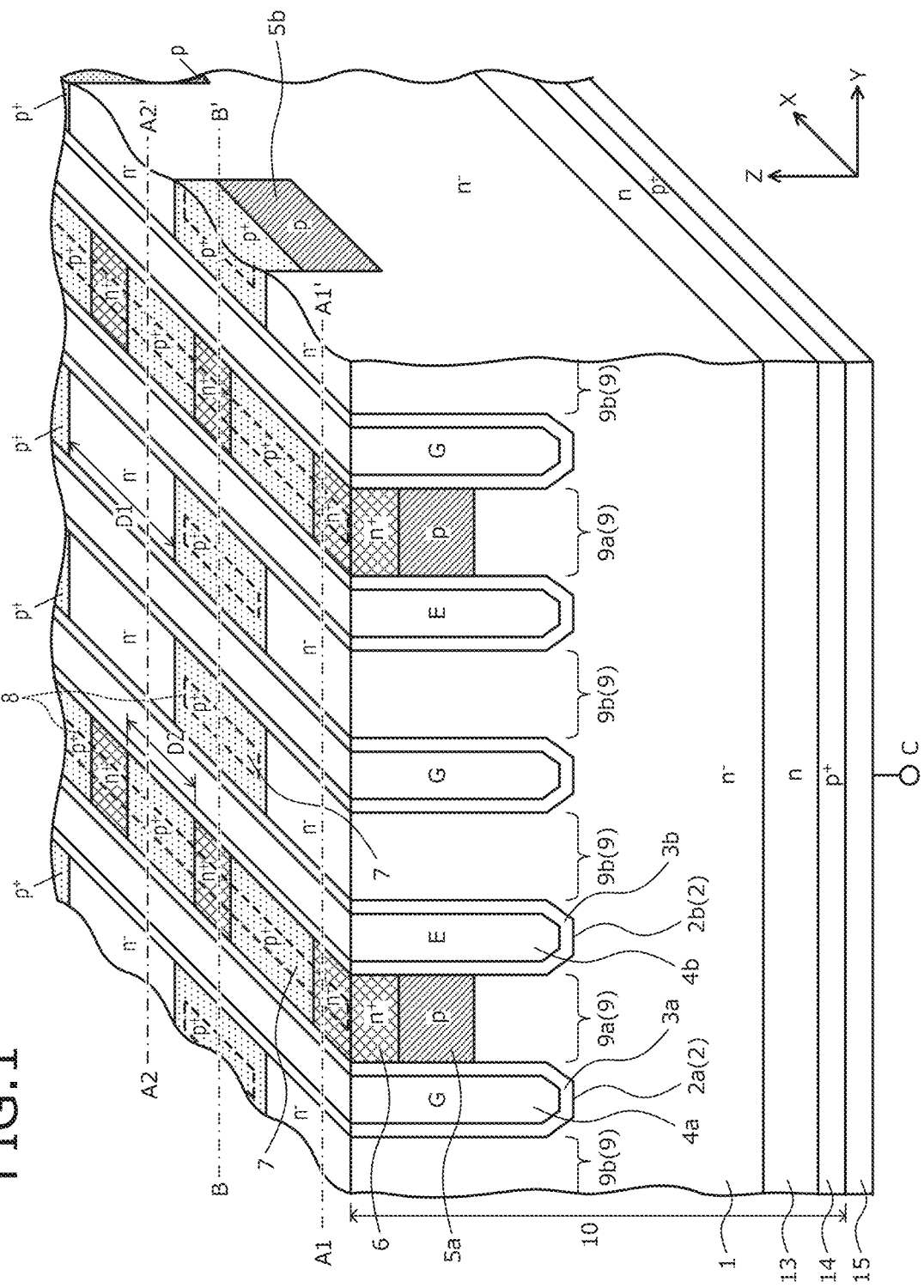
FIG. 1 is a perspective view of a structure of a semiconductor device according to a first embodiment.

First, problems associated with the conventional techniques will be discussed. In the conventional trench gate IGBT, at the time of turn ON, holes injected from the $p^+$-type contact layer 114 to the $n^-$-type drift layer 101 are easily pulled from a connection part with the emitter electrode 112, to the emitter electrode 112 and the ON voltage may increase.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2B:
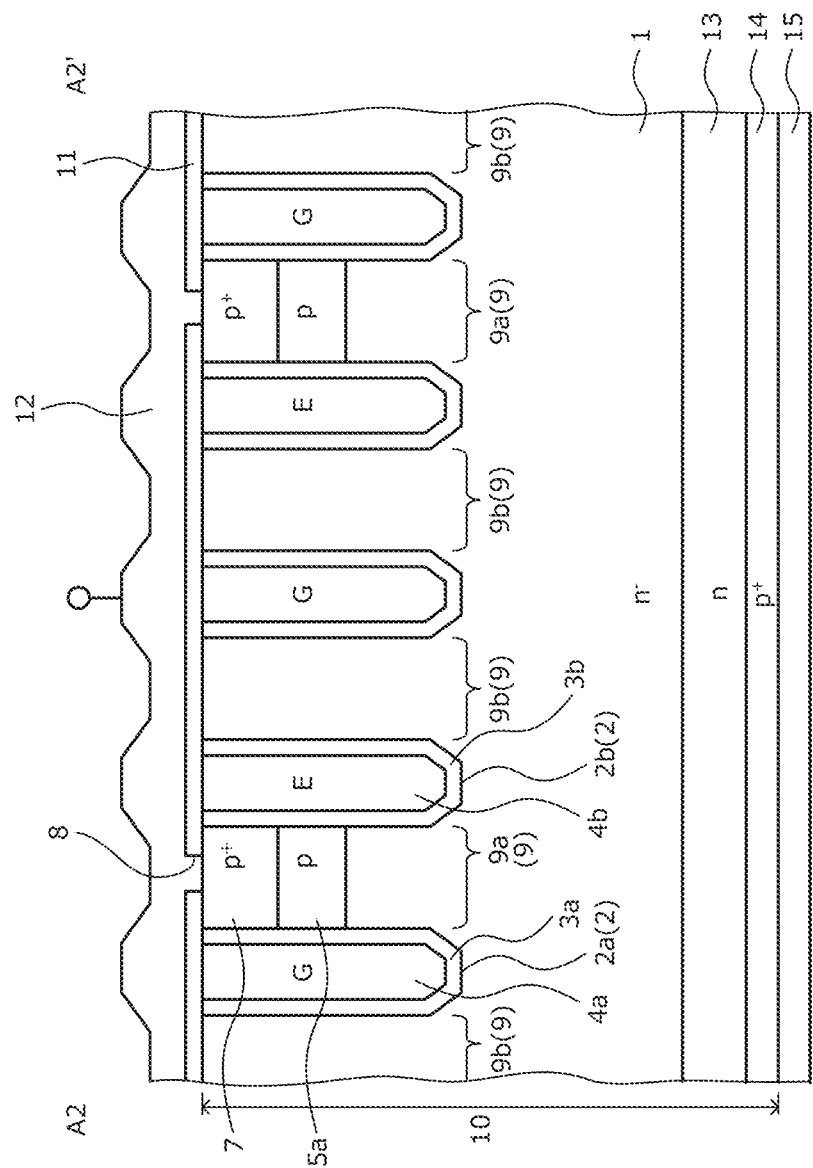
FIG. 2B is a cross-sectional view at cutting line A2-A2' in FIG. 1.

A structure of the semiconductor device according to a first embodiment will be described. FIG. 1 is a perspective view of a structure of the semiconductor device according to the first embodiment. FIG. 2A is a cross-sectional view at cutting line A1-A1' in FIG. 1. FIG. 2B is a cross-sectional view at cutting line A2-A2' in FIG. 1. FIG. 3 is a cross-sectional view at cutting line B-B' in FIG. 1. In FIG. 1, to clearly depict a planar layout of a region (mesa region) 9 between adjacent trenches 2, an interlayer insulating film 11 and an emitter electrode (first electrode) 12 are not depicted. A planar layout is a planar shape and an arrangement configuration of constituent parts as viewed from a front surface side of a semiconductor substrate (semiconductor chip) 10.

Further, in FIGS. 1, 2A, 2B, and 3, only an active region is depicted and an edge termination region surrounding a periphery of the active region is not depicted (similarly in FIGS. 4, 5A, 5B, 6, 7, 8A, 8B, 9, 10, 11A, 11B, 12, 13, 14A, 14B, 15, 16, 17, 22, and 23). The active region is a region in which current flows in an ON state. In the active region, unit cells (element functional units) of the trench gate IGBT are disposed adjacently. The edge termination region is a region between the active region and a chip edge. The edge termination region mitigates electric field at a substrate front surface (front surface of the semiconductor substrate 10) side of an $n^-$-type drift layer 1 and sustains the breakdown voltage. In the edge termination region, for example, a breakdown voltage structure combining a guard ring, a field plate, a RESURF, etc. is disposed.

The semiconductor device according to the first embodiment depicted in FIGS. 1, 2A, 2B, and 3 is a trench gate IGBT that includes a gate electrode (first gate electrode) 4a constituting a MOS gate structure that contributes to gate control and an electrode (dummy gate electrode: second gate electrode) 4b constituting a dummy MOS gate structure that does not contribute to gate control. In particular, at the front surface side of the semiconductor substrate 10, the trenches 2 are provided at a predetermined pitch. The trenches 2 reach a predetermined depth in a depth direction (direction from the front surface of the semiconductor substrate 10 toward a rear surface) from the front surface of the semiconductor substrate 10. The trenches 2 are disposed in a striped planar layout extending parallel to the front surface of the semiconductor substrate 10. Some of the trenches 2 are gate trenches (first trenches) 2a and the other trenches 2 are dummy trenches (second trenches) 2b. Depths of the gate trenches 2a and the dummy trenches 2b, for example, are substantially equal.

A mix of first and second mesa regions 9a, 9b described hereinafter are disposed in the active region and a repeating pattern of the gate trenches 2a and the dummy trenches 2b along a direction (width direction: hereinafter, the second direction) Y orthogonal to a direction (length direction: hereinafter, the first direction) X along which the trenches 2 extend in a striped shape may be variously changed. The repeating pattern is a layout in which one pattern, in which one or more of the gate trenches 2a and one or more of the dummy trenches 2b are disposed in a predetermined pattern, is arranged along the second direction Y. For example, along the second direction Y, plural dummy trenches 2b are disposed for each single gate trench 2a. In FIG. 1, a single gate trench 2a and a single dummy trench 2b are disposed to alternate repeatedly along the second direction Y. A modification example is depicted in second and third embodiments described hereinafter.

In each of the gate trenches 2a, along an inner wall of the gate trench 2a, a gate insulating film 3a is provided and on the gate insulating film 3a, a gate electrode 4a is provided. The gate electrode 4a is electrically connected with a gate potential G (e.g., 5V). The gate electrode 4a constitutes a trench gate structure that contributes to element control. In each dummy trench 2b, along an inner wall the dummy trench 2b, an insulating film (dummy gate insulating film) 3b is provided and on the dummy gate insulating film 3b, a dummy gate electrode 4b is provided. The dummy gate electrode 4b, at a non-depicted part, is electrically connected with an emitter electric potential E and is electrically insulated from the gate electrode 4a by the dummy gate insulating film 3b. The dummy gate electrode 4b may be in contact with an emitter electrode 12. The dummy gate electrode 4b constitutes a trench gate structure that does not contribute to element control. Configuration of the dummy gate electrode 4b excluding connection of the emitter electric potential E is similar to the gate electrode 4a.

The dummy gate electrode 4b is set to the emitter electric potential E, whereby at a part thereof along the dummy trenches 2b, at the time of turn ON, an inversion layer of holes is formed. As a result, Miller capacitance (capacitance between the gate and collector functioning as input capacitance twice the gain due to the Miller effect) may be reduced. In some mesa regions (hereinafter, first mesa regions) 9a among regions (mesa regions) 9 sandwiched between the trenches 2, a first p-type base region (first semiconductor region) 5a is provided in a surface region (a surface layer at the front surface of the semiconductor substrate 10) overall, while in other mesa regions (hereinafter, second mesa regions) 9b, a second p-type base region (second semiconductor region) 5b is selectively provided at a predetermined interval D1 along the first direction X. A part of the semiconductor substrate 10 excluding the first and the second p-type base regions 5a, 5b, a later-described n-type buffer layer 13 and p$^+$-type contact layer (fourth semiconductor region) 14 constitutes the n$^-$-type drift layer 1.

The first mesa regions 9a are regions functioning as MOS gates. At at least one side wall of the gate trenches 2a, a MOS gate is driven. The first mesa regions 9a may be regions sandwiched by the gate trenches 2a, or may be regions sandwiched between one of the gate trenches 2a and one of the dummy trenches 2b. Further, the first mesa regions 9a may be adjacent to each other along the second direction Y, or may be adjacent to the second mesa regions 9b.

The second mesa regions 9b are regions functioning as MOS gates. The second mesa regions 9b may be regions sandwiched between the gate trenches 2a, or may be regions sandwiched between the dummy trenches 2b, or may be regions sandwiched between a gate trench 2a and a dummy trench 2b. Further, the second mesa regions 9b may be adjacent to the first mesa regions 9a along the second direction Y, or may be adjacent to each other.

FIGS. 1, 2A, 2B, and 3 depict a case in which the first and the second mesa regions 9a, 9b are regions between a gate trench 2a and a dummy trench 2b, and the first mesa regions 9a are adjacent to each other across two of the second mesa regions 9b, along the second direction Y. In the second mesa regions 9b, at a part other than the second p-type base region 5b, the n$^-$-type drift layer 1 reaches to the substrate front surface and the second p-type base region 5b is separated into plural segments by the n$^-$-type drift layer 1. In other words, in a surface region of the second mesa regions 9b, the second p-type base region 5b and the n$^-$-type drift layer 1 are disposed to alternate repeatedly along the first direction X.

The second p-type base region 5b is selectively provided in the second mesa regions 9b, whereby at the time of turn OFF, the second mesa regions 9b are depleted by a depletion layer spreading from a pn junction of the second p-type base region 5b and the n$^-$-type drift layer 1; and breakdown voltage at the second mesa regions 9b is sustained. The breakdown voltage is a voltage limit at which no errant operation or damage of an element occurs. The breakdown voltage of the second mesa regions 9b decreases when the interval D1 between adjacent second p-type base regions 5b along the first direction X is too wide. Therefore, the interval D1 between adjacent second p-type base regions 5b along the first direction X is set to be narrow and of a magnitude enabling the breakdown voltage at the second mesa regions 9b to be sustained.

Figure 19:
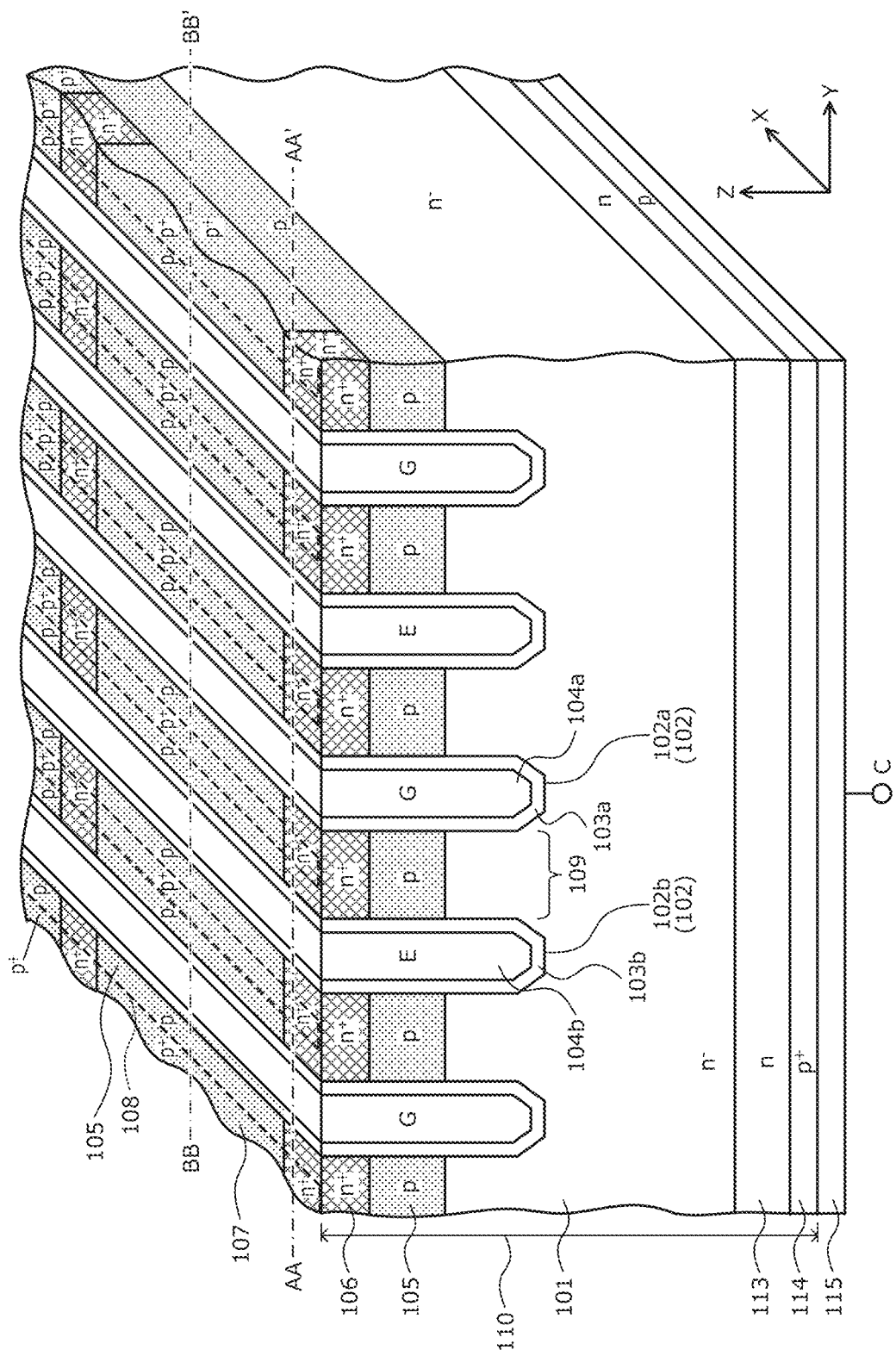
FIG. 19 is a perspective view of a structure of a conventional trench gate IGBT.

Further, the second p-type base region 5b is selectively provided in the second mesa regions 9b, whereby even in a case like the conventional structure (refer to FIGS. 19 to 21) where the p-type base region 105 is provided in a surface region overall in the active region, a total mathematical area of connection parts of the emitter electrode 12 and the first and the second p-type base regions 5a, 5b is reduced. Therefore, compared to the conventional structure, at the time of turn ON, holes injected into the n$^-$-type drift layer 1 from the p$^+$-type contact layer 14 may be inhibited from being pulled from a connection part of the semiconductor substrate 10 and the emitter electrode 12, to the emitter electrode 12.

The first and the second p-type base regions 5a, 5b extend to the trenches 2 positioned on each side thereof along the second direction Y. Depths of the first and the second p-type base regions 5a, 5b (depths from the substrate front surface) are shallower than a depth of the trenches 2 (the gate trenches 2a and the dummy trenches 2b). The depths of the first and the second p-type base regions 5a, 5b, for example, are substantially equal. Impurity concentrations of the first and the second p-type base regions 5a, 5b, for example, are substantially equal.

In the first p-type base region 5a, an n$^+$-type emitter region (third semiconductor region) 6 and a p$^+$-type contact region 7 are selectively provided. The n$^+$-type emitter region 6 is provided at a predetermined interval D2, along the first direction X. Channel (electron inversion layer) density of the IGBT is determined by the number of the n$^+$-type emitter regions 6 disposed in the first mesa regions 9a. The n$^+$-type emitter region 6 extends to at least one of the gate trenches 2a among the trenches 2 positioned on each side of the n$^+$-type emitter region 6, along the second direction Y, and opposes the gate electrode 4a across the gate insulating film 3a at the side wall of the gate trench 2a. FIG. 1 depicts a case in which the n$^+$-type emitter region 6 extends to the trenches 2 positioned on each side of the n$^+$-type emitter region 6, along the second direction Y.

The p$^+$-type contact region 7 is selectively provided between adjacent n$^+$-type emitter regions 6, along the first direction X, and is in contact with each of the n$^+$-type emitter region 6 positioned on each side of the p$^+$-type contact region 7, along the first direction X. The p$^+$-type contact region 7 is provided extending to each of the trenches 2 positioned on each side of the p$^+$-type contact region 7, along the second direction Y. For example, in the first mesa regions 9a, at central parts of the first mesa regions 9a, a contact hole 8 is formed having a length that is substantially equal to that of trenches 2 along the first direction X. In this case, the p$^+$-type contact region 7 extends to the trenches 2 positioned on each side of the p$^+$-type contact region 7, along the second direction Y.

In the second p-type base region 5b, the p$^+$-type contact region 7 is selectively provided. The p$^+$-type contact region 7 is provided in a region that includes a part corresponding to the contact hole 8 that constitutes a connection part with the emitter electrode 12. For example, in the second mesa regions 9b, the contact hole 8 is formed in a region that is at a central part of each of the second mesa regions 9b and that includes a part where the second p-type base region 5b is disposed. The contact hole 8 is formed in a part where at least the second p-type base region 5b is disposed. FIG. 1 depicts a state in which the contact hole 8 is formed only at a part where the second p-type base region 5b is disposed. In this case, the p$^+$-type contact region 7, for example, is disposed in a surface region of the second p-type base region 5b overall, and extends to the trenches 2 on each side of the p$^+$-type contact region 7, along the second direction Y. In the second p-type base region 5b, the n$^+$-type emitter region 6 is not provided.

The second p-type base region 5b is formed partially in the second mesa regions 9b, whereby in the second mesa regions 9b, only the part of the second p-type base region 5b contributes as capacitance (input capacitance) between the gate and emitter, and the capacitance between the gate and emitter of the IGBT overall decreases. Therefore, even when the n$^+$-type emitter region 106 is provided in all of the mesa regions 109 like in the conventional structure (refer to FIGS. 19 to 21), turn ON time may be shortened. Further, the n$^+$-type emitter region 6 is not provided in the second p-type base region 5b and therefore, the gate electrodes 4a in the gate trenches 2a between adjacent second mesa regions 9b do not contribute to gate control. A depth of the p$^+$-type contact region 7 in the first and the second p-type base regions 5a, 5b is a depth equal to or greater than a depth of the n$^+$-type emitter region 6, and may be deeper than the depth of the n$^+$-type emitter region 6. FIGS. 2B and 3 depict a case in which the depth of the p$^+$-type contact region 7 is deeper than the depth of the n$^+$-type emitter region 6 (similarly in FIGS. 5B, 6, 8B, 9, 11B, 12, 14B, and 15).

Between adjacent second mesa regions 9b, the gate electrode 4a may be disposed even though the gate electrode 4a does not contribute to gate control. A reason for this is as follows. At the time of turn ON, at a part of the second p-type base region 5b along the gate trench 2a, an electron inversion layer is formed. As a result, holes in the n$^-$-type drift layer 1 are inhibited from being pulled from the connection part of the emitter electrode 12 and the second p-type base region 5b, to the emitter electrode 12. Further, since the Miller capacitance increases, at the time of turn ON, an accumulation of holes in the n$^-$-type drift layer 1 is facilitated.

The interlayer insulating film 11 is provided at the front surface of the semiconductor substrate 10 overall so as to cover the gate electrodes 4a and the dummy gate electrodes 4b. In the interlayer insulating film 11, the contact hole 8 is respectively provided above the first and the second mesa regions 9a, 9b. The contact holes 8 of the first mesa regions 9a have a linear planar shape extending along the first direction X, and at the central parts of the first mesa regions 9a, the contact holes 8 expose the n$^+$-type emitter regions 6 and the p$^+$-type contact regions 7. The contact holes 8 of the second mesa regions 9b have a substantially rectangular planar shape and at the central parts of the second mesa regions 9b, expose the p$^+$-type contact regions 7.

The emitter electrode 12 is in contact with the n$^+$-type emitter regions 6 and the p$^+$-type contact regions 7 of the first mesa regions 9a and the p$^+$-type contact regions 7 of the second mesa regions 9b, and is electrically connected with these regions and the first and the second p-type base regions 5a, 5b. Further, the emitter electrode 12 is electrically insulated from the gate electrodes 4a by the interlayer insulating film 11. In a surface layer at the rear surface of the semiconductor substrate 10, the n-type buffer layer 13 is provided. Further, in the surface layer at the rear surface of the semiconductor substrate 10, at a depth deeper than a depth of the n-type buffer layer 13, the p$^+$-type contact layer 14 is provided in contact with the n-type buffer layer 13. A contact electrode (second electrode) 15 is in contact with the p$^+$-type contact layer 14.

As described, according to the first embodiment, in some mesa regions (second mesa regions), the p-type base region (second p-type base region) is selectively provided, whereby at the time of turn ON, at a part of the mesa regions where the p-type base region is not disposed, the hole concentration is maintained to be high. As a result, compared to a case in which the p-type base region is provided in the surface region of the active region overall like the conventional structure (refer to FIGS. 19 to 21), at the time of turn ON, resistance near the substrate front surface decreases, enabling the ON resistance to be reduced. Further, according to the first embodiment, the dummy gate electrodes of the emitter electric potential are provided, thereby enabling the Miller capacitance to be reduced. Therefore, switching characteristics (turn OFF time, turn OFF loss, etc.) may be enhanced.

Figure 4:
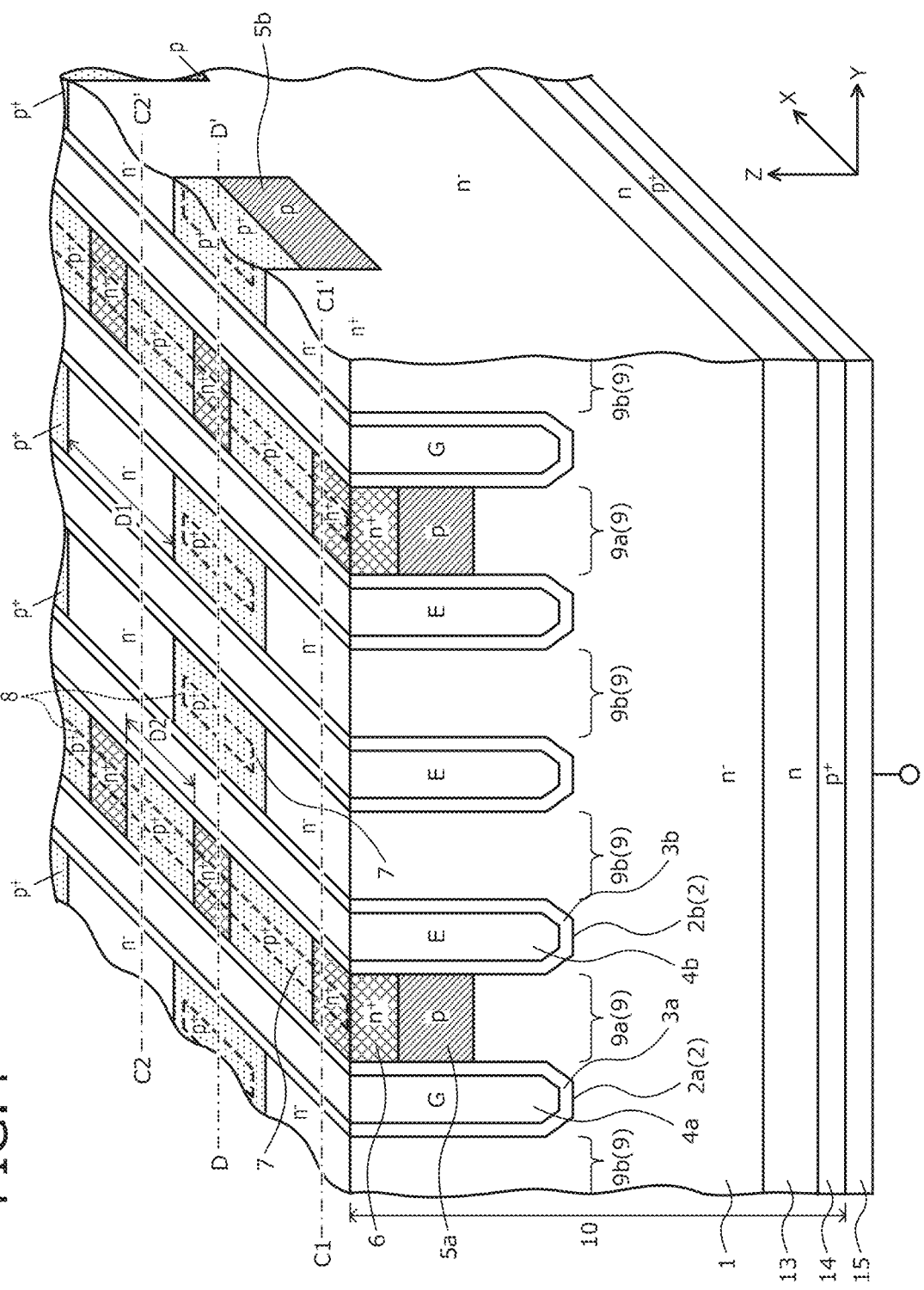
FIG. 4 is a perspective view of a structure of the semiconductor device according to a second embodiment.
Figure 5B:
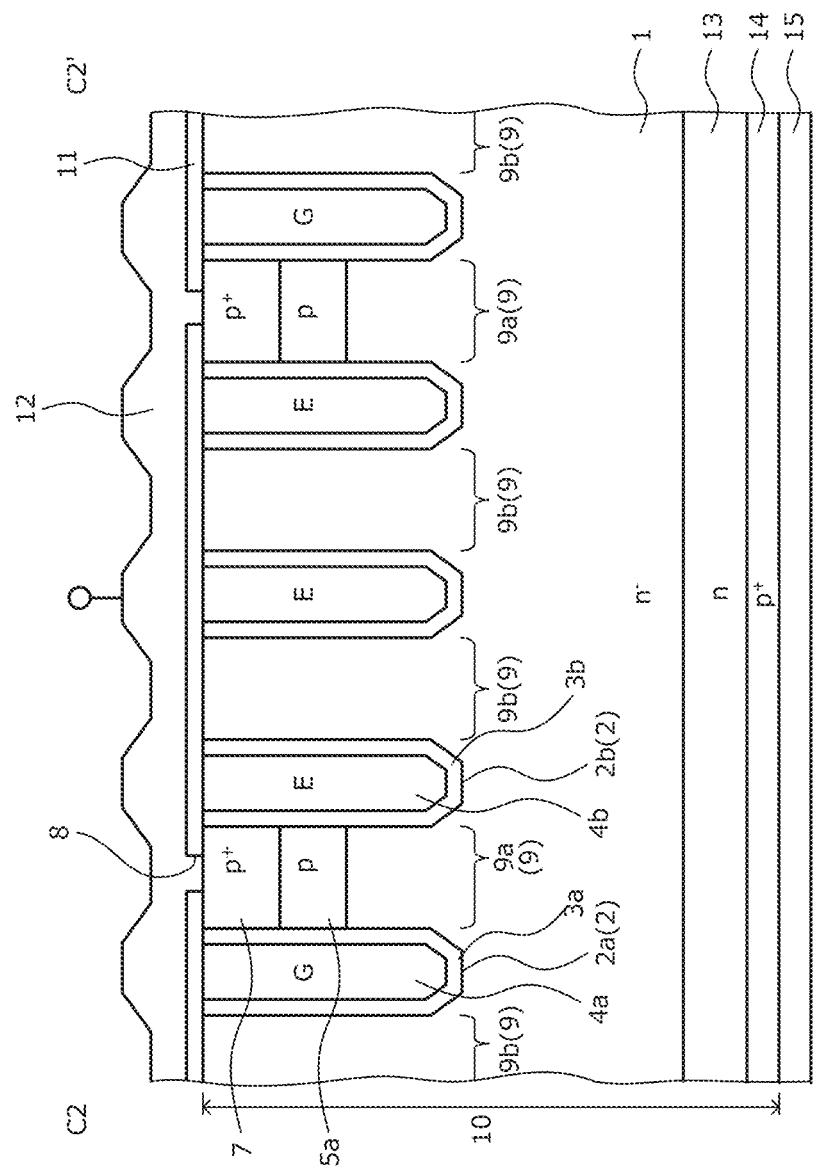
FIG. 5B is a cross-sectional view at cutting line C2-C2' in FIG. 4.

A structure of the semiconductor device according to a second embodiment will be described. FIG. 4 is a perspective view of a structure of the semiconductor device according to the second embodiment. FIG. 5A is a cross-sectional view at cutting line C1-C1' in FIG. 4. FIG. 5B is a cross-sectional view at cutting line C2-C2' in FIG. 4. FIG. 6 is a cross-sectional view at cutting line D-D' in FIG. 4. The semiconductor device according to the second embodiment differs from the semiconductor device according to the first embodiment in that the second mesa regions 9b are regions sandwiched between the dummy trenches 2b.

For example, similarly to the first embodiment, the first mesa regions 9a are adjacent to each other across two of the second mesa regions 9b, along the second direction Y. In this case, the gate trenches 2a and the dummy trenches 2b are disposed along the second direction Y, in a repeating pattern where for every one gate trench 2a disposed, three dummy trenches 2b are disposed. In other words, the trenches 2 sandwiched between adjacent second mesa regions 9b are the dummy trenches 2b and the dummy gate electrodes 4b at the emitter electric potential E are disposed between the adjacent second mesa regions 9b.

In the second p-type base region 5b, the n$^+$-type emitter region 6 is not disposed and therefore, as described, the gate electrode disposed between adjacent second mesa regions 9b does not contribute to gate control. Therefore, even when the dummy gate electrodes 4b are disposed between adjacent second mesa regions 9b, channel density of the IGBT is substantially equal to that in the first embodiment. Further, the dummy gate electrodes 4b are disposed between adjacent second mesa regions 9b, whereby at parts of the n$^-$-type drift layer 1 along the dummy trenches 2b, a hole inversion layer is formed, enabling the Miller capacitance to be reduced.

As described, according to the second embodiment, even when the repeating pattern of the gate trench and the dummy trench is variously changed, effects similar to those of the first embodiment may be obtained.

Figure 7:
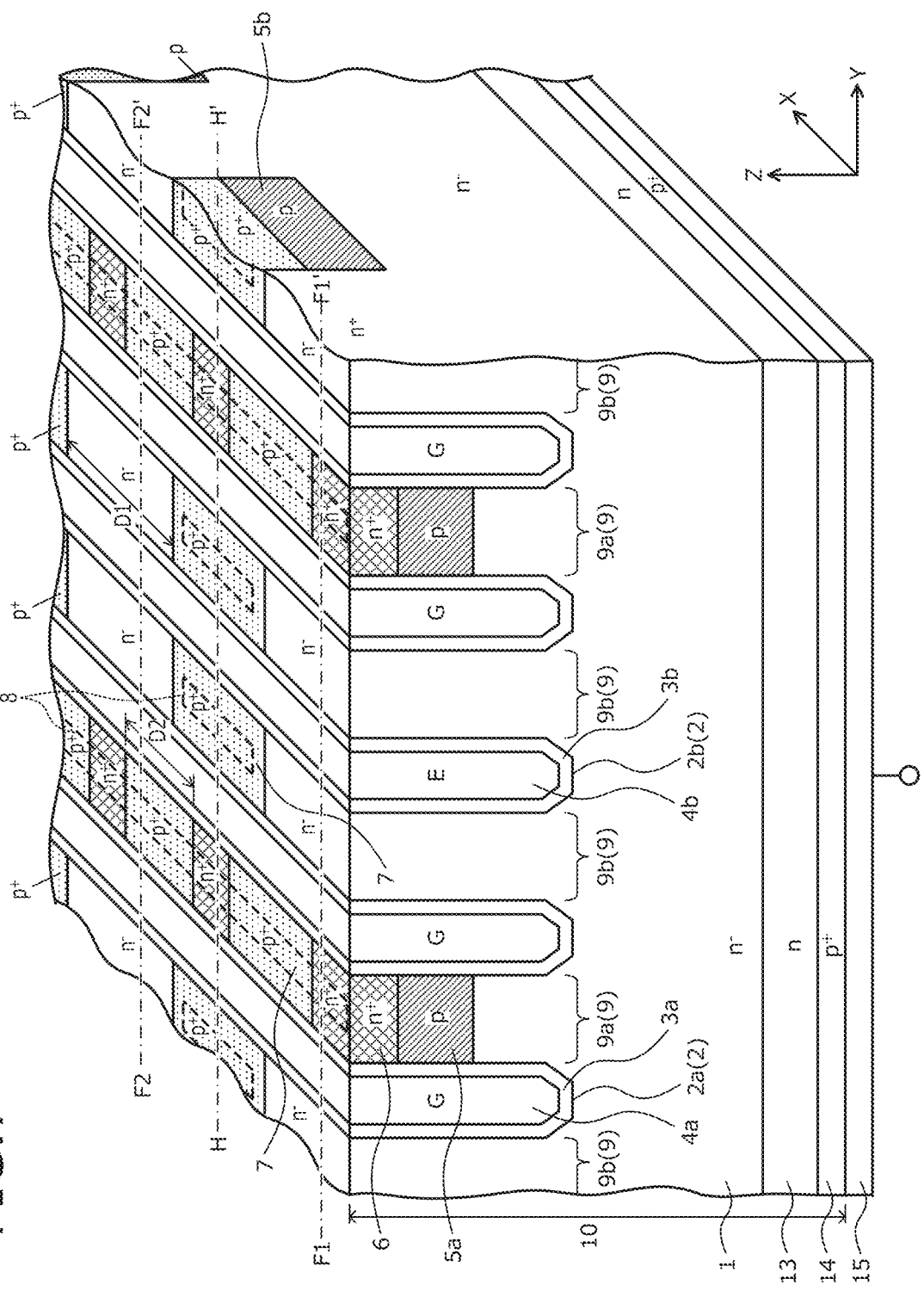
FIG. 7 is a perspective view of a structure of the semiconductor device according to a third embodiment.
Figure 8A:
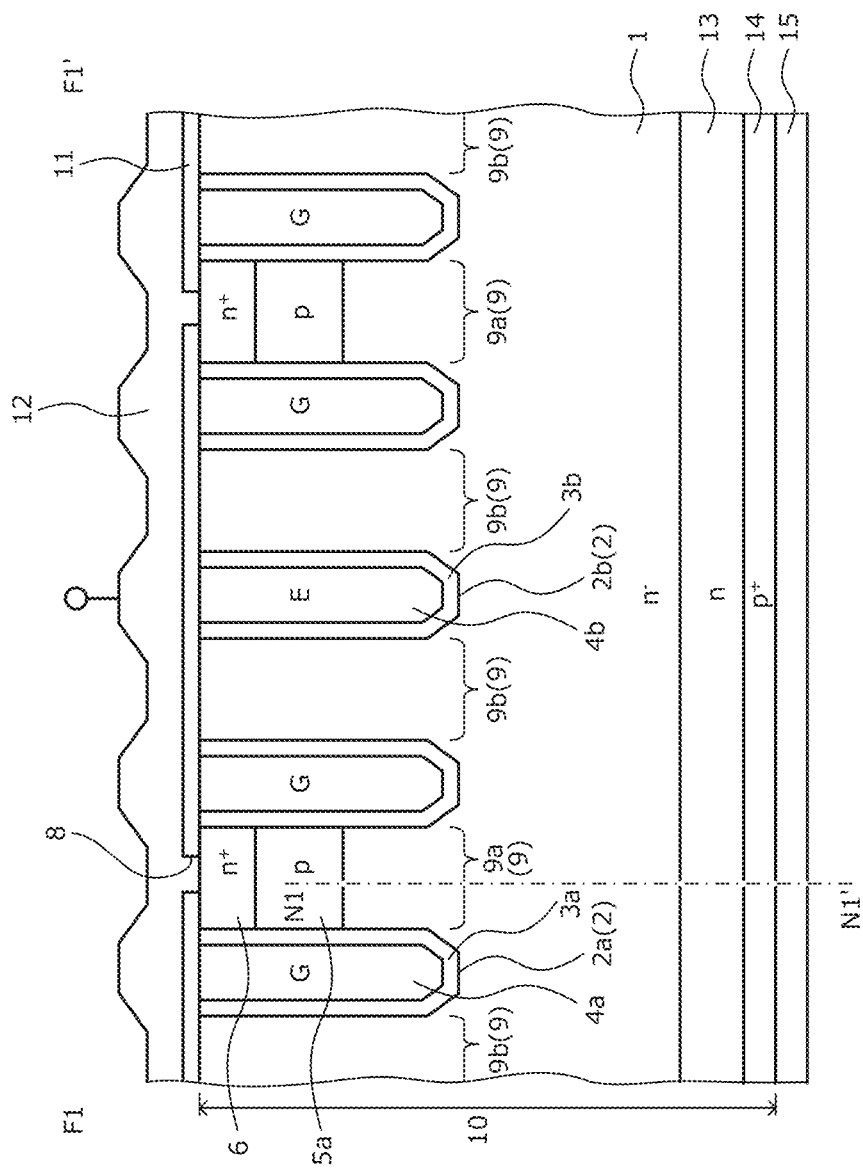
FIG. 8A is a cross-sectional view at cutting line F1-F1' in FIG. 7.
Figure 8B:
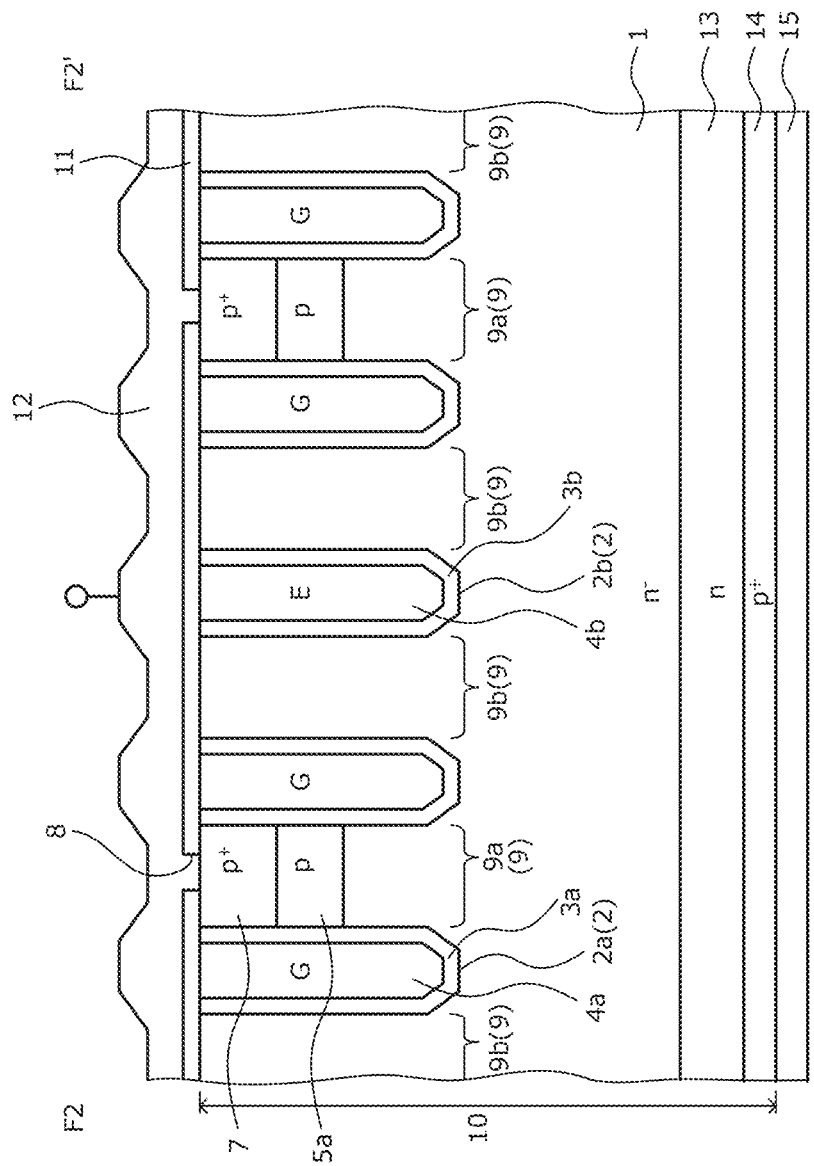
FIG. 8B is a cross-sectional view at cutting line F2-F2' in FIG. 7.
Figure 9:
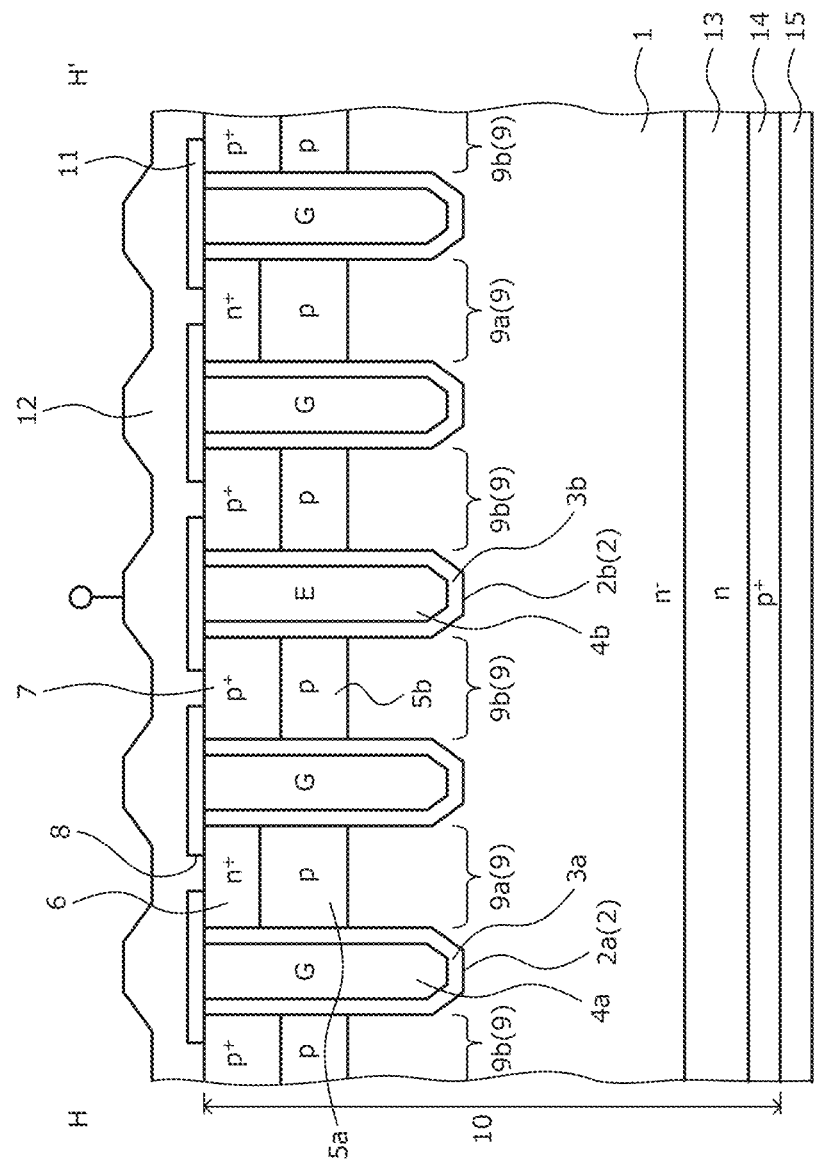
FIG. 9 is a cross-sectional view at cutting line H-H' in FIG. 7.

A structure of the semiconductor device according to a third embodiment will be described. FIG. 7 is a perspective view of a structure of the semiconductor device according to the third embodiment. FIG. 8A is a cross-sectional view at cutting line F1-F1' in FIG. 7. FIG. 8B is a cross-sectional view at cutting line F2-F2' in FIG. 7. FIG. 9 is a cross-sectional view at cutting line H-H' in FIG. 7. The semiconductor device according to the third embodiment differs from the semiconductor device according to the first embodiment in that the first mesa regions 9a are regions sandwiched between the gate trenches 2a.

For example, similarly to the first embodiment, the first mesa regions 9a are adjacent to each other across two of the second mesa regions 9b, along the second direction Y. In this case, the gate trenches 2a and the dummy trenches 2b are disposed along the second direction Y, in a repeating pattern where for every two of the gate trenches 2a disposed, one dummy trench 2b is disposed. In other words, a MOS gate is driven at opposing side walls of adjacent gate trenches 2a that sandwich the first mesa regions 9a. Additionally, similarly to the second embodiment, the dummy gate electrodes 4b at the emitter electric potential E are disposed between adjacent second mesa regions 9b.

As described, according to the third embodiment, even when the repeating pattern of the gate trench and the dummy trench is variously changed, effects similar to those of the first and the second embodiments may be obtained.

Figure 10:
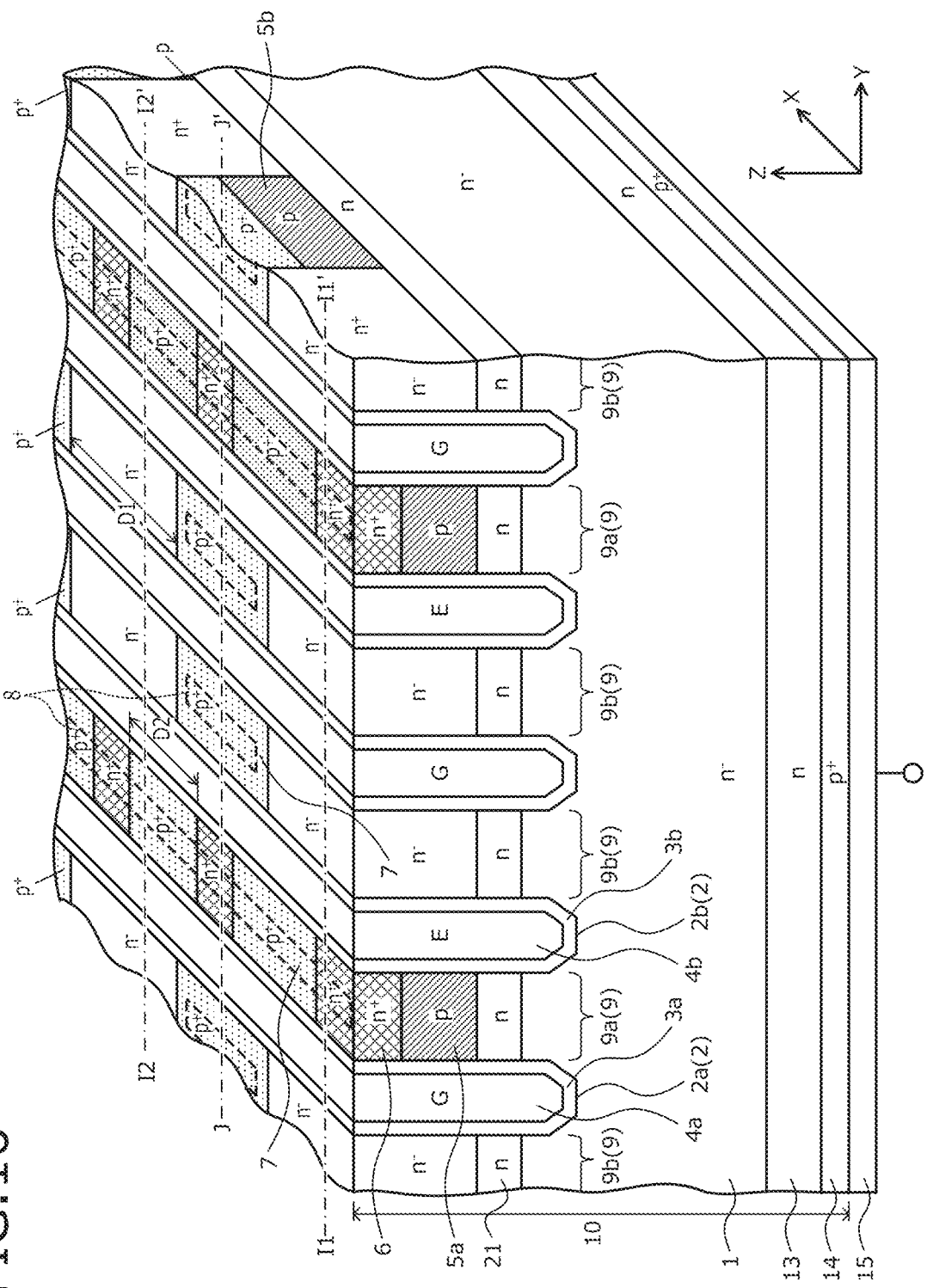
FIG. 10 is a perspective view of the semiconductor device according to a fourth embodiment.
Figure 11A:
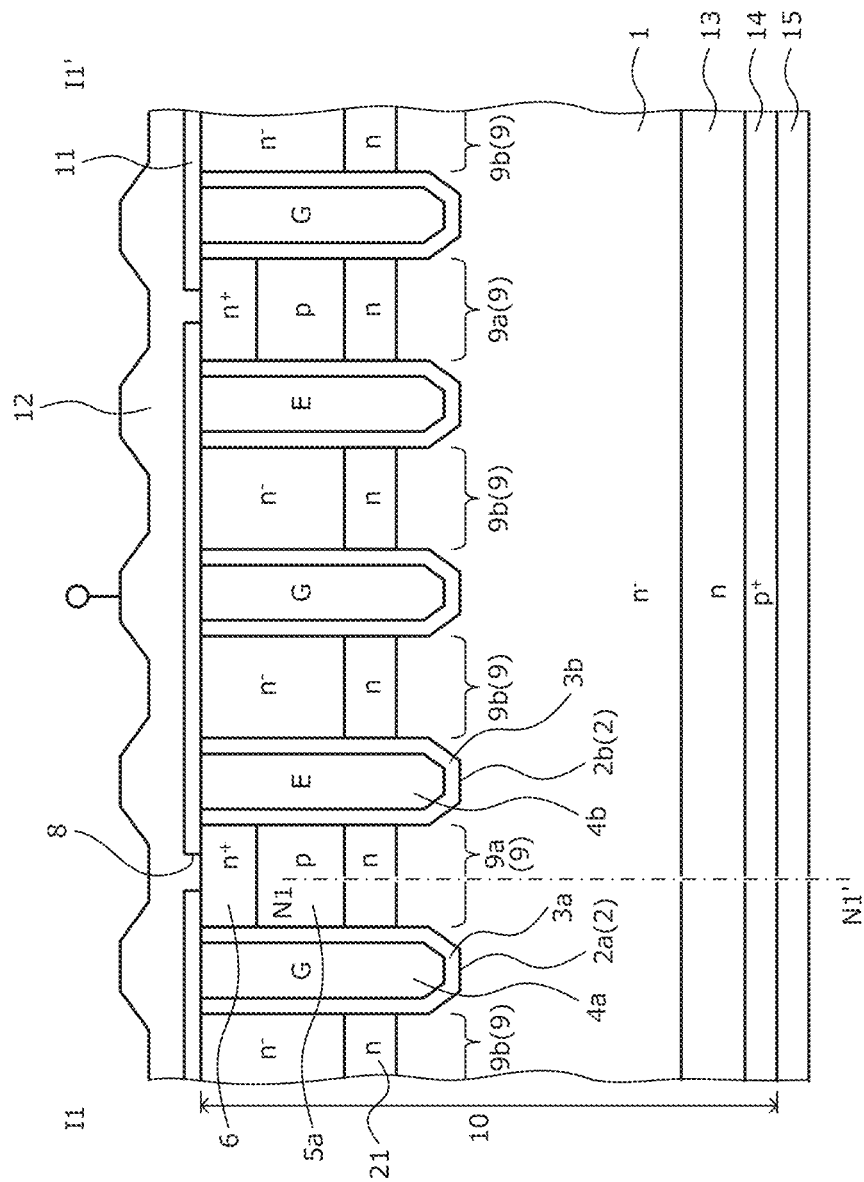
FIG. 11A is a cross-sectional view at cutting line I1-I1' in FIG. 10.

A structure of the semiconductor device according to a fourth embodiment will be described. FIG. 10 is a perspective view of the semiconductor device according to the fourth embodiment. FIG. 11A is a cross-sectional view at cutting line I1-I1' in FIG. 10. FIG. 11B is a cross-sectional view at cutting line I2-I2' in FIG. 10. FIG. 12 is a cross-sectional view at cutting line J-J' in FIG. 10. The semiconductor device according to the fourth embodiment differs from the semiconductor device according to the first embodiment in that an accumulation layer 21 is provided. The accumulation layer (fifth semiconductor region) 21 has a function of becoming a barrier of minority carriers (holes) of the n$^-$-type drift layer 1, at the time of turn ON, and a function of accumulating minority carriers in the n$^-$-type drift layer 1.

In particular, the accumulation layer 21 is provided at a position deeper from the substrate front surface than are the first and the second p-type base regions 5a, 5b, and has a substantially uniform thickness across the active region, the accumulation layer 21 further being in contact with the first and the second p-type base regions 5a, 5b. A depth (i.e., interface of the accumulation layer 21 and the n$^-$-type drift layer 1) of the accumulation layer 21 from the substrate front surface is shallower than the depth of the trenches 2 (the gate trenches 2a and the dummy trenches 2b). In other words, the accumulation layer 21 is provided having a length substantially equal to lengths of the first and the second mesa regions 9a, 9b and the trenches 2, along the first direction X, and the accumulation layer 21 extends to the trenches 2 positioned on each side thereof, along the second direction Y.

The fourth embodiment may be applied to the second and third embodiments.

As described, according to the fourth embodiment, effects similar to those of the first to the third embodiments may be obtained. Further, according to the fourth embodiment, the accumulation layer is provided, whereby at the time of turn ON, the hole density of the n$^-$-type drift layer near the interfaces with the first and the second p-type base regions may be increased, enabling the ON voltage to be further reduced.

Figure 13:
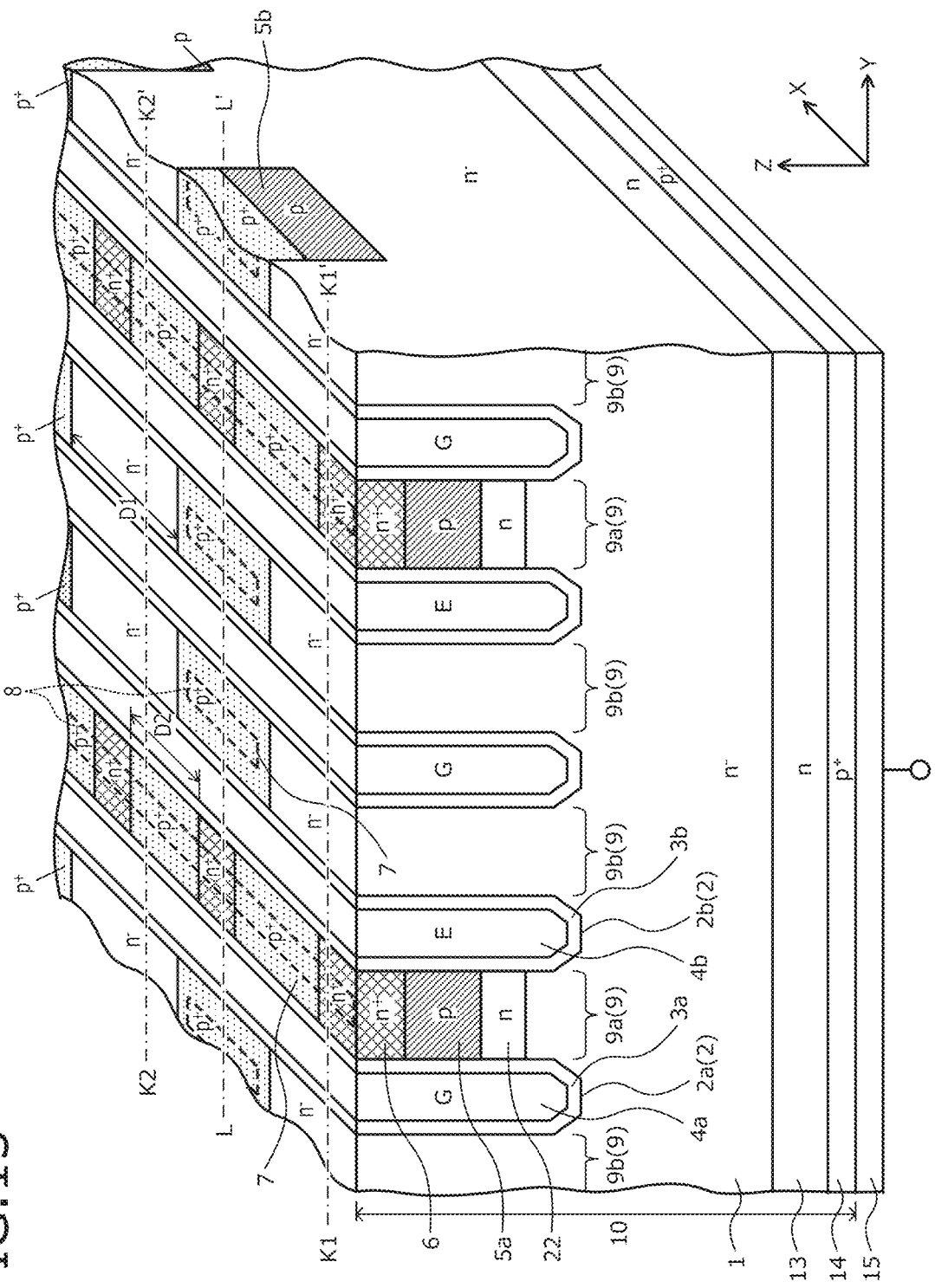
FIG. 13 is a perspective view of a structure of the semiconductor device according to a fifth embodiment.
Figure 15:
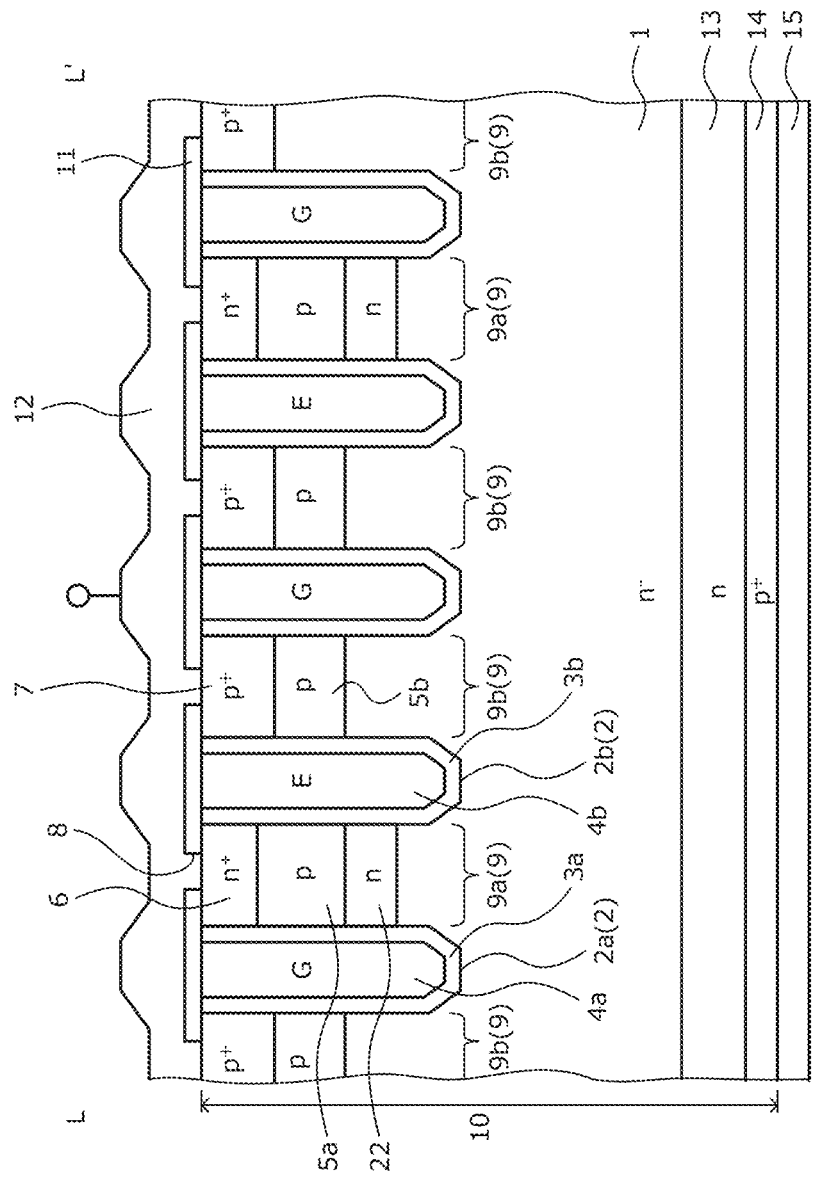
FIG. 15 is a cross-sectional view at cutting line L-L' in FIG. 13.

A structure of the semiconductor device according to a fifth embodiment will be described. FIG. 13 is a perspective view of a structure of the semiconductor device according to the fifth embodiment. FIG. 14A is a cross-sectional view at cutting line K1-K1' in FIG. 13. FIG. 14B is a cross-sectional view at cutting line K2-K2' in FIG. 13. FIG. 15 is a cross-sectional view at cutting line L-L' in FIG. 13. The semiconductor device according to the fifth embodiment differs from the semiconductor device according to the fourth embodiment in that an accumulation layer (fifth semiconductor region) 22 is provided only directly beneath (opposing part in the depth direction at a collector side of the first p-type base region 5a) the first p-type base regions 5a of the first mesa regions 9a.

The accumulation layer 22 is provided at a position deeper from the substrate front surface than is the first p-type base region 5a and is in contact with the first p-type base region 5a. A depth (i.e., an interface of the accumulation layer 22 and the n$^-$-type drift layer 1) of the accumulation layer 22 from the substrate front surface may be shallower than the depths of the trenches 2 (the gate trenches 2a and the dummy trenches 2b). In other words, the accumulation layer 22 is provided in the first mesa regions 9a and has a length substantially equal to that of the trenches 2, along the first direction X, and the accumulation layer 22 extends to the trenches 2 positioned on each side thereof, along the second direction Y.

The accumulation layer 22 may be further disposed at a part opposing the second p-type base regions 5b of the second mesa regions 9b, in the depth direction.

As described, according to the fifth embodiment, effects similar to those of the first to the third embodiments may be obtained. Further, according to the fifth embodiment, the accumulation layer is provided only directly beneath the p-type base region (p-type base region in which the n$^+$-type emitter region is provided) of the mesa region functioning as a MOS gate, whereby effects similar to those of the fourth embodiment are achieved.

Figure 16:
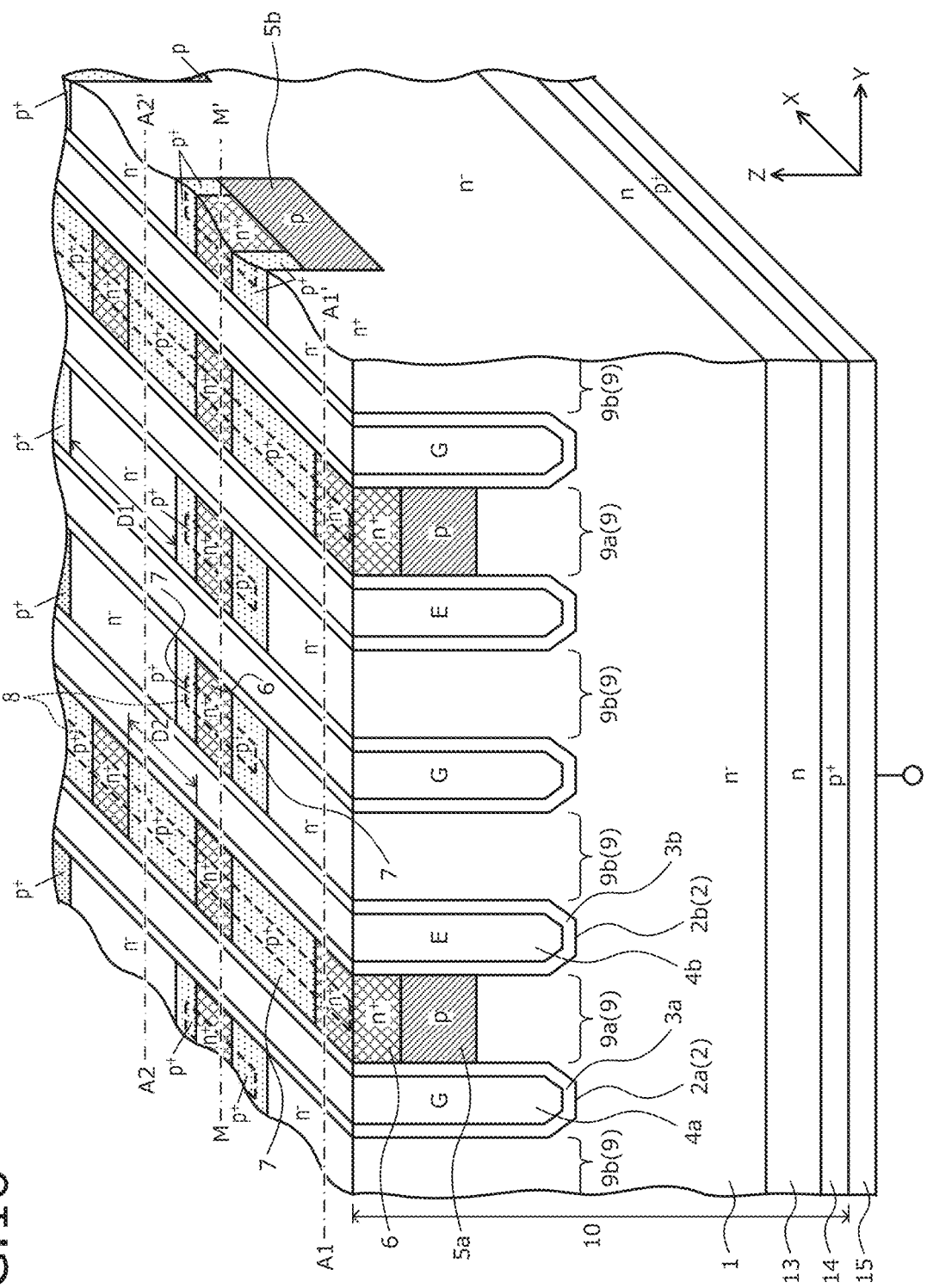
FIG. 16 is a perspective view of a structure of the semiconductor device according to a sixth embodiment.
Figure 17:
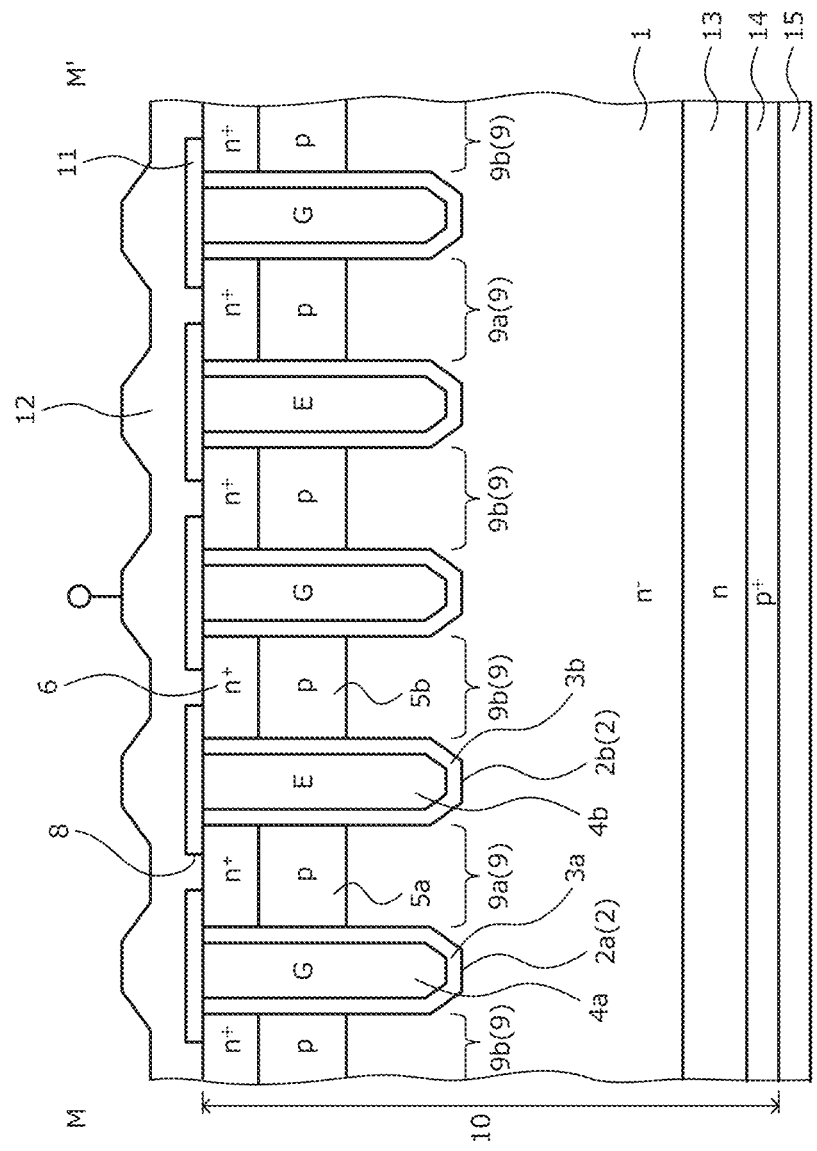
FIG. 17 is a cross-sectional view at cutting line M-M' in FIG. 16.

A structure of the semiconductor device according to a sixth embodiment will be described. FIG. 16 is a perspective view of a structure of the semiconductor device according to the sixth embodiment. FIG. 17 is a cross-sectional view at cutting line M-M' in FIG. 16. Cross-sectional views at cutting line A1-A1' and cutting line A2-A2' in FIG. 16 are similar to those of the first embodiment (refer to FIGS. 2A, 2B). The semiconductor device according to the sixth embodiment differs from the semiconductor device according to the first embodiment in that in the second p-type base regions 5b of the second mesa regions 9b, the n$^+$-type emitter region 6 is selectively provided.

In other words, the first and the second mesa regions 9a, 9b also function as MOS gates. In the second mesa regions 9b, the n$^+$-type emitter region 6, for example, is disposed at a central part of the second p-type base region 5b, along the first direction X and extends to the trenches 2 positioned on each side of the n$^+$-type emitter region 6, along the second direction Y. The p$^+$-type contact regions 7 are provided to be in contact with the n$^+$-type emitter region 6 on each side of the n$^+$-type emitter region 6, along the first direction X. The n$^+$-type emitter region 6 and the p$^+$-type contact region 7 of the second mesa regions 9b are exposed by the contact holes 8 of the second mesa regions 9b.

Further, in the sixth embodiment, the second mesa regions 9b become regions functioning as MOS gates. Therefore, the gate trenches 2a and the dummy trenches 2b are disposed so that the second mesa regions 9b become regions sandwiched by a gate trench 2a and a dummy trench 2b. In the second mesa regions 9b, the n$^+$-type emitter region 6 extends to the gate trench 2a of the trenches 2 positioned on each side of the n$^+$-type emitter region 6, along the second direction Y. The n$^+$-type emitter region 6 opposes the gate electrode 4a across the gate insulating film 3a at the side wall of the gate trench 2a.

The sixth embodiment may be applied to the second to the fifth embodiments.

As described, according to the sixth embodiment, effects similar to those of the first to the fifth embodiments may be obtained. Further, according to the sixth embodiment, the channel density of the IGBT may be increased.

Figure 18:
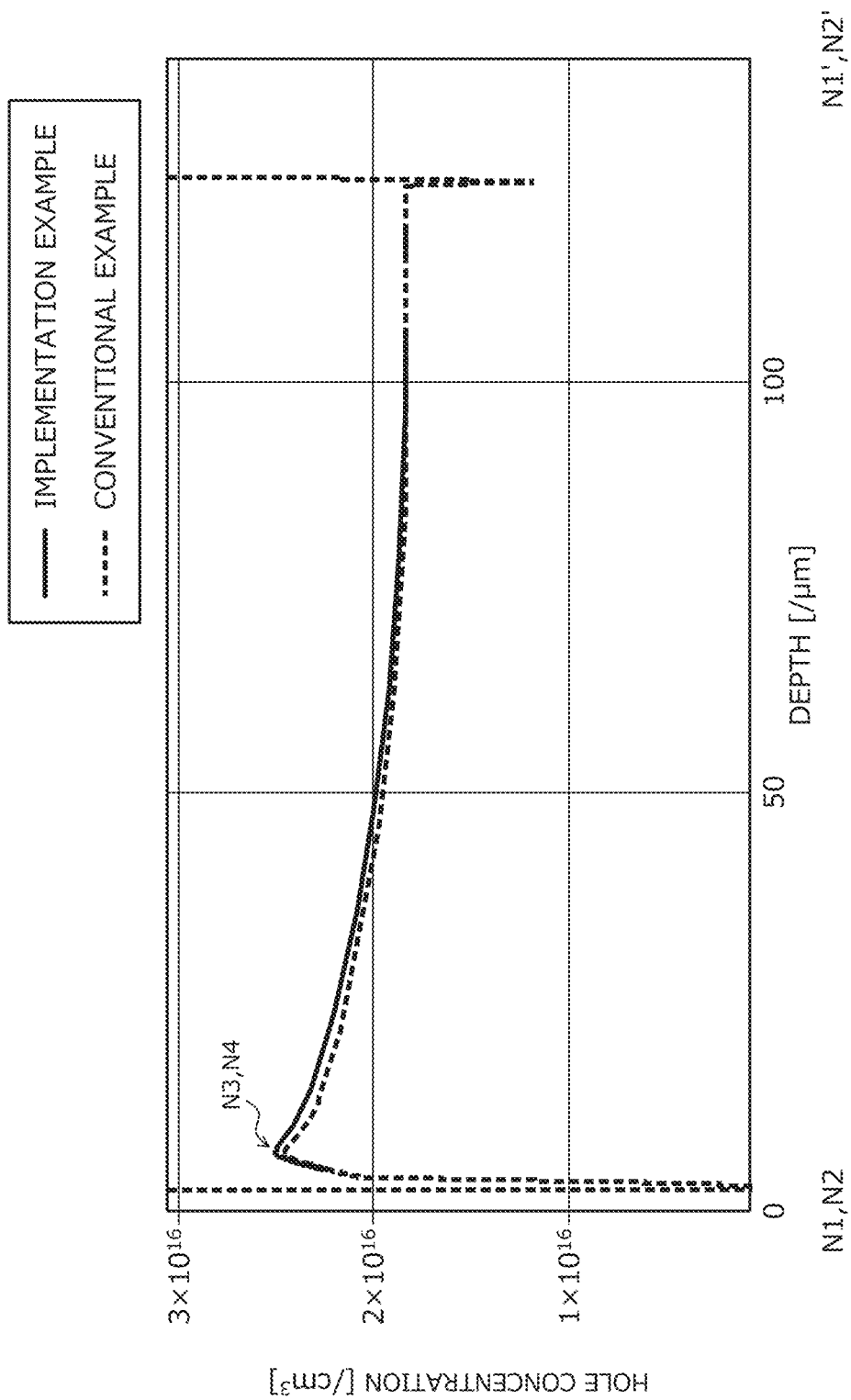
FIG. 18 is a characteristics diagram of hole concentration at a time of turn ON for an implementation example.

The ON voltage was verified. The hole concentration at the time of turn ON for an IGBT (hereinafter, implementation example) having the described structure of the semiconductor device according to the first embodiment (refer to FIGS. 1 to 3) is depicted in FIG. 18. FIG. 18 is a characteristics diagram of hole concentration at the time of turn ON for the implementation example. In FIG. 18, a horizontal axis indicates depth from pn junctions (depth=0 μm) of the first and the second p-type base regions 5a, 5b with the n$^-$-type drift layer 1, and a vertical axis indicates hole concentration at cutting line N1-N1' in FIG. 2A. The hole concentration in the implementation example shows a maximum value at N3 near a boundary of the n$^-$-type drift layer 1 with the first p-type base region 5a of the first mesa regions 9a.

Figure 20:
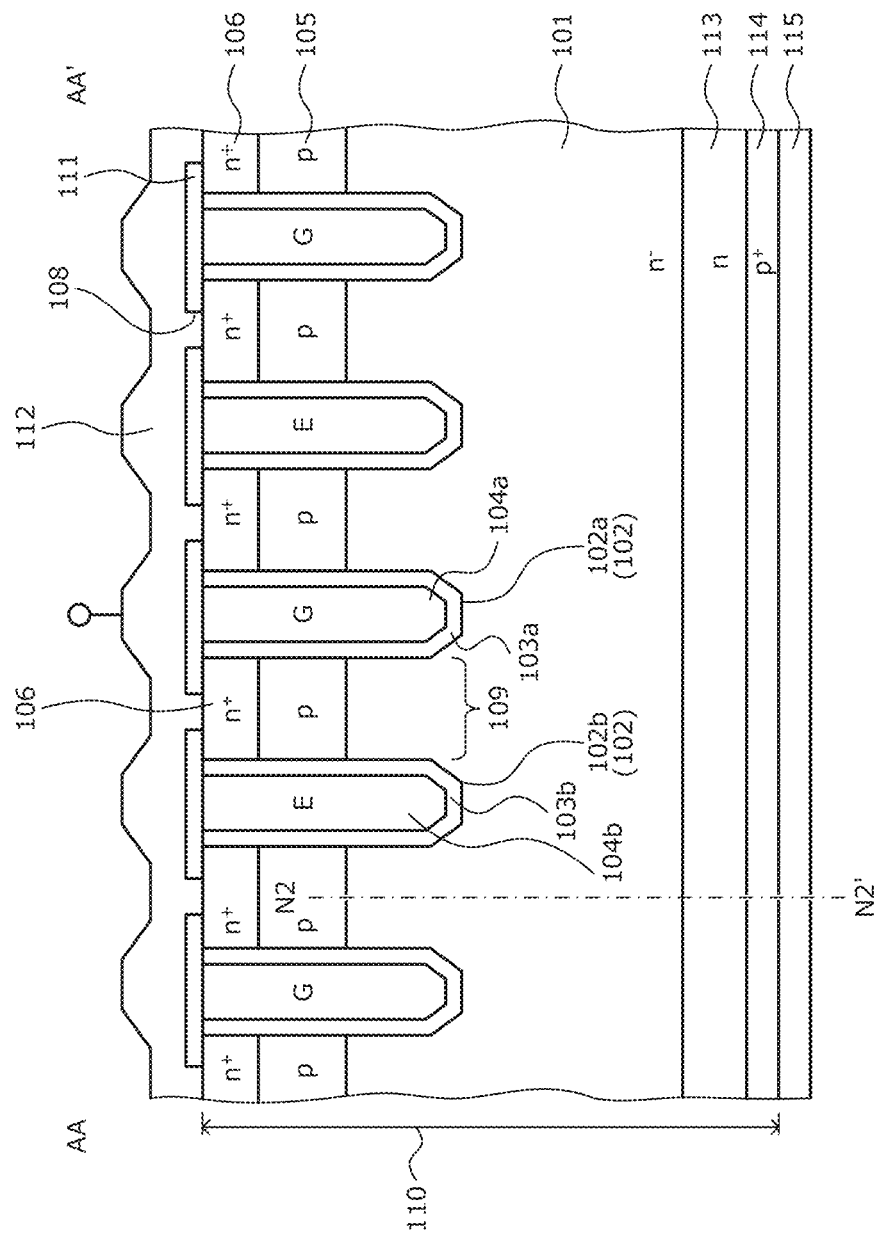
FIG. 20 is a cross-sectional view at cutting line AA-AA' in FIG. 19.
Figure 21:
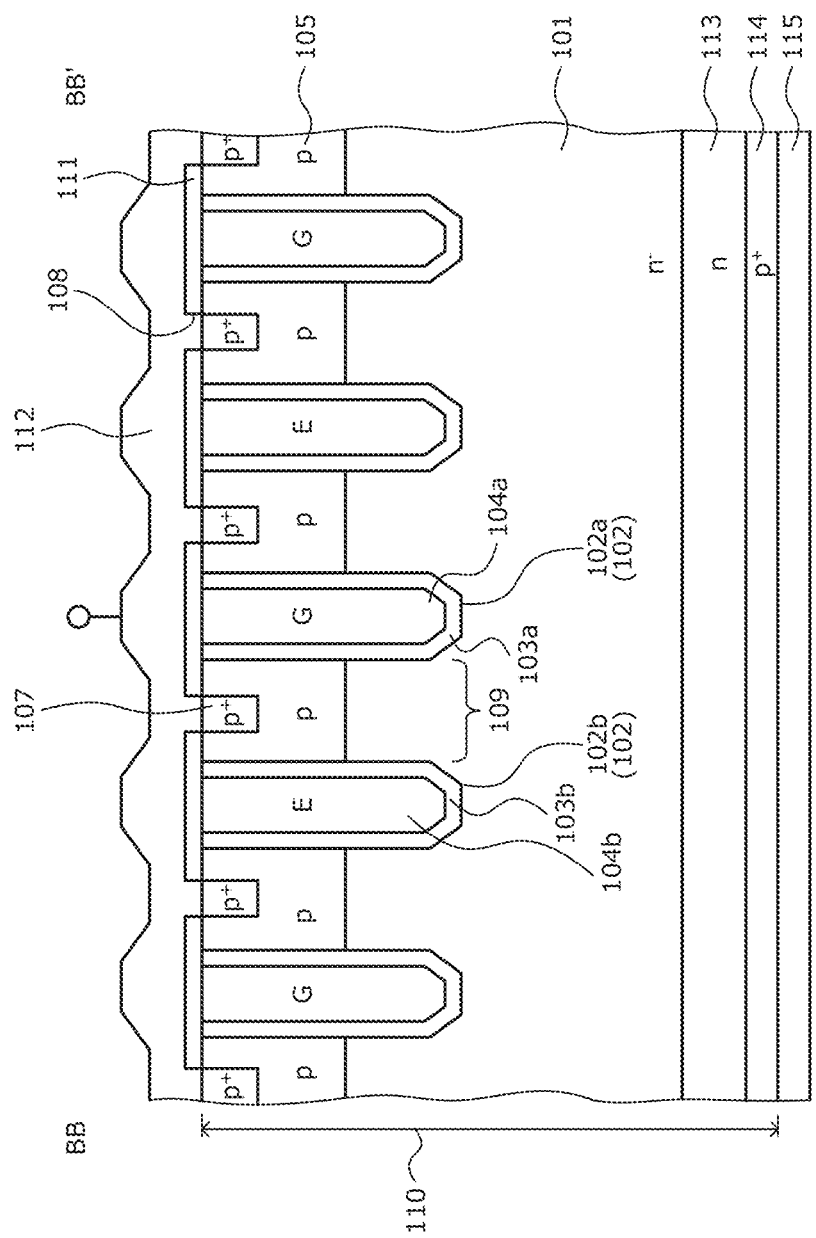
FIG. 21 is a cross-sectional view at cutting line BB-BB' in FIG. 19.

For comparison, the hole concentration at the time of turn ON for an IGBT (hereinafter, conventional example) having the conventional structure (refer to FIGS. 19 to 21) is also depicted in FIG. 18. For the conventional example, in FIG. 18, the depth from a pn junction (depth=0 μm) between the p-type base region 105 and the n$^-$-type drift layer 101 is indicated along the horizontal axis, and hole concentration at cutting line N2-N2' in FIG. 20 is indicated along the vertical axis. The conventional example has the same number of the n$^+$-type emitter region 106 as the implementation example, and the channel density is equal to that in the implementation example. The hole concentration of the conventional example, similarly with the implementation example, shows a maximum value at N4, near a border of the n$^-$-type drift layer 101 with the p-type base region 105 of the mesa region 109.

From the results depicted in FIG. 18, for the implementation example, it was confirmed that as compared to the conventional example, at the time of turn ON, the hole density (minority carrier density) in the n$^-$-type drift layer 1 may be increased and the ON voltage may be reduced.

Figure 22:
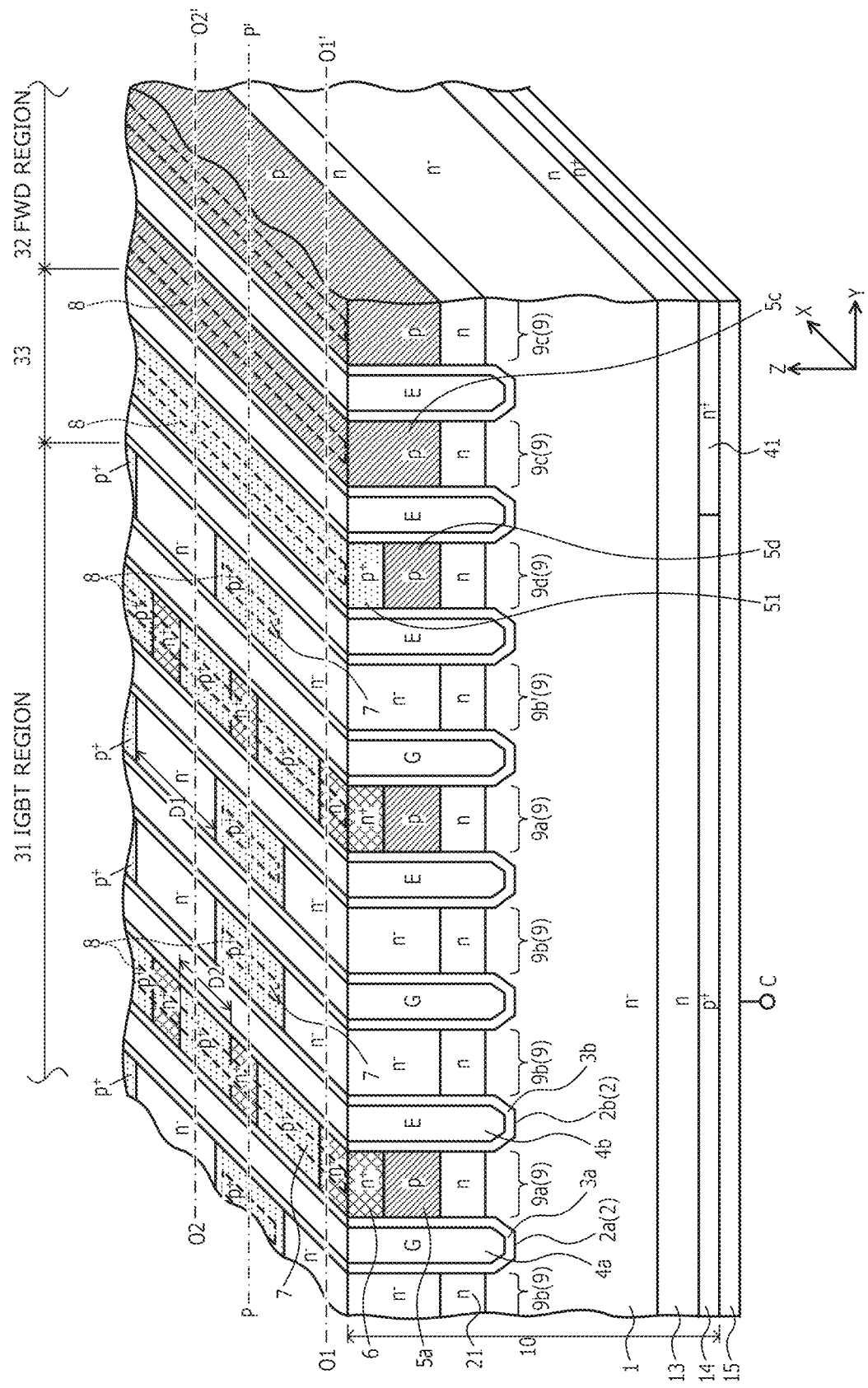
FIG. 22 is a perspective view of a structure of the semiconductor device according to a seventh embodiment.
Figure 23:
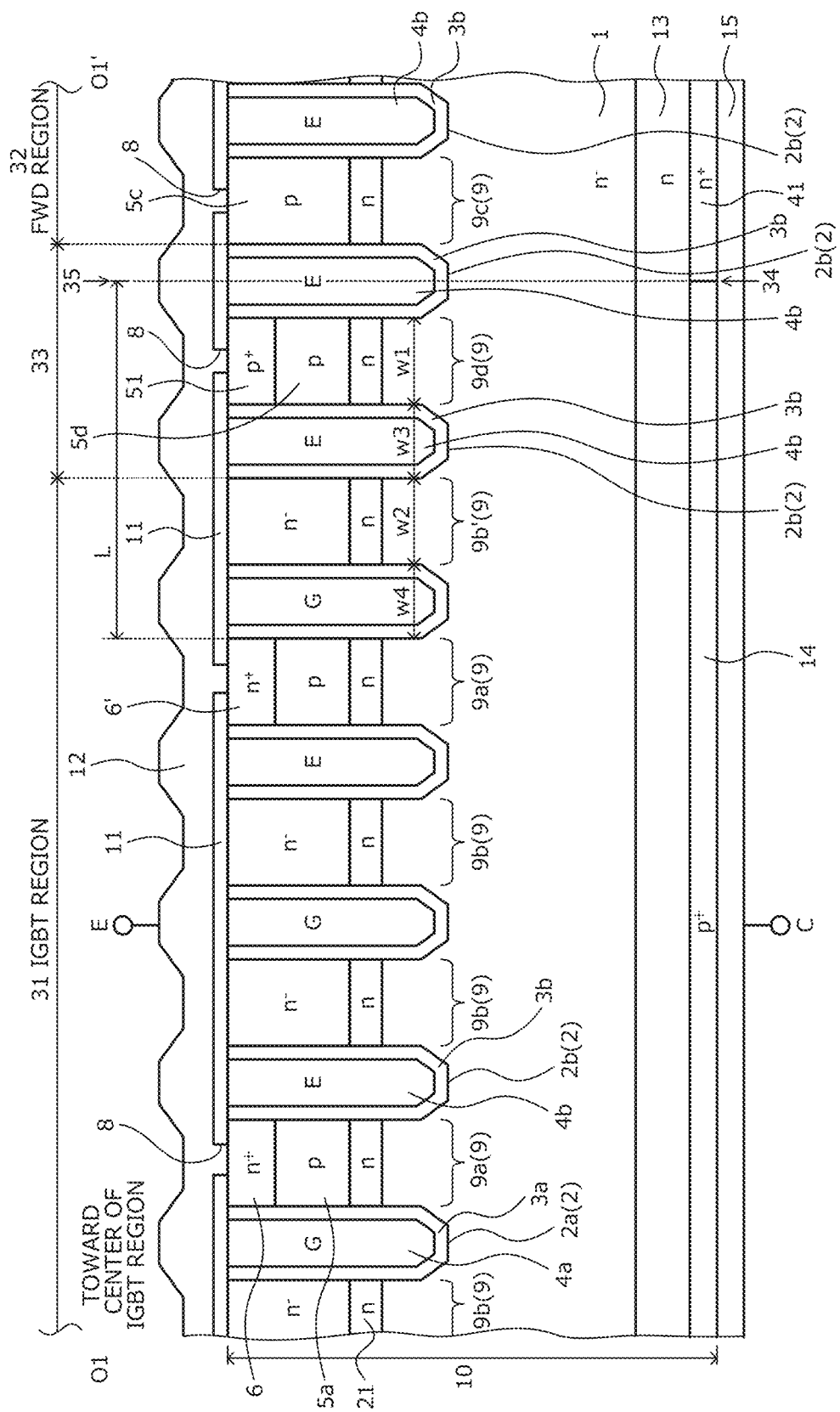
FIG. 23 is a cross-sectional view at cutting line O1-O1', in FIG. 22.
Figure 24:
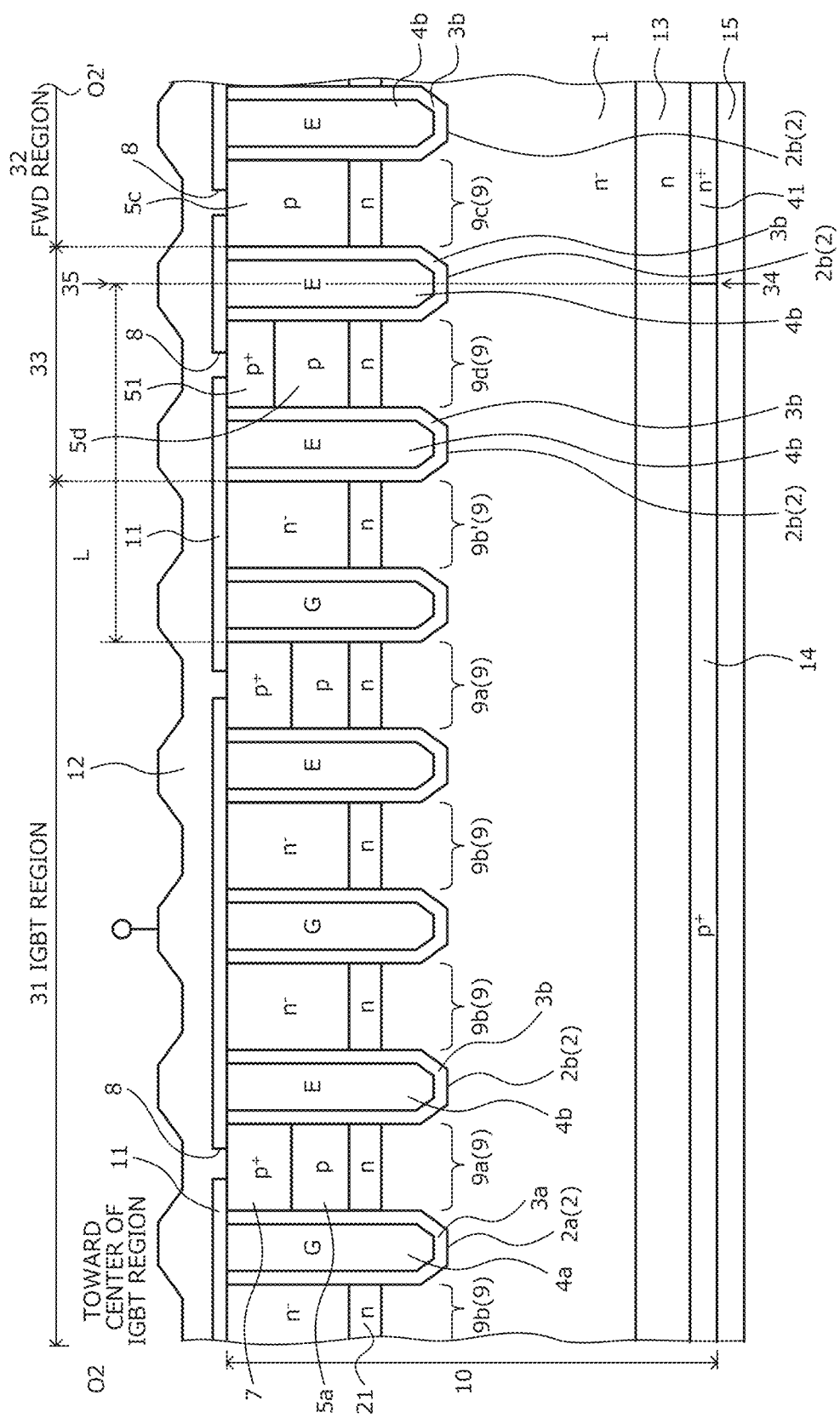
FIG. 24 is a cross-sectional view at cutting line O2-O2' in FIG. 22.

A structure of the semiconductor device according to a seventh embodiment will be described. FIG. 22 is a perspective view of a structure of the semiconductor device according to the seventh embodiment. FIG. 23 is a cross-sectional view at cutting line O1-O1', in FIG. 22. FIG. 24 is a cross-sectional view at cutting line O2-O2' in FIG. 22.

Figure 25:
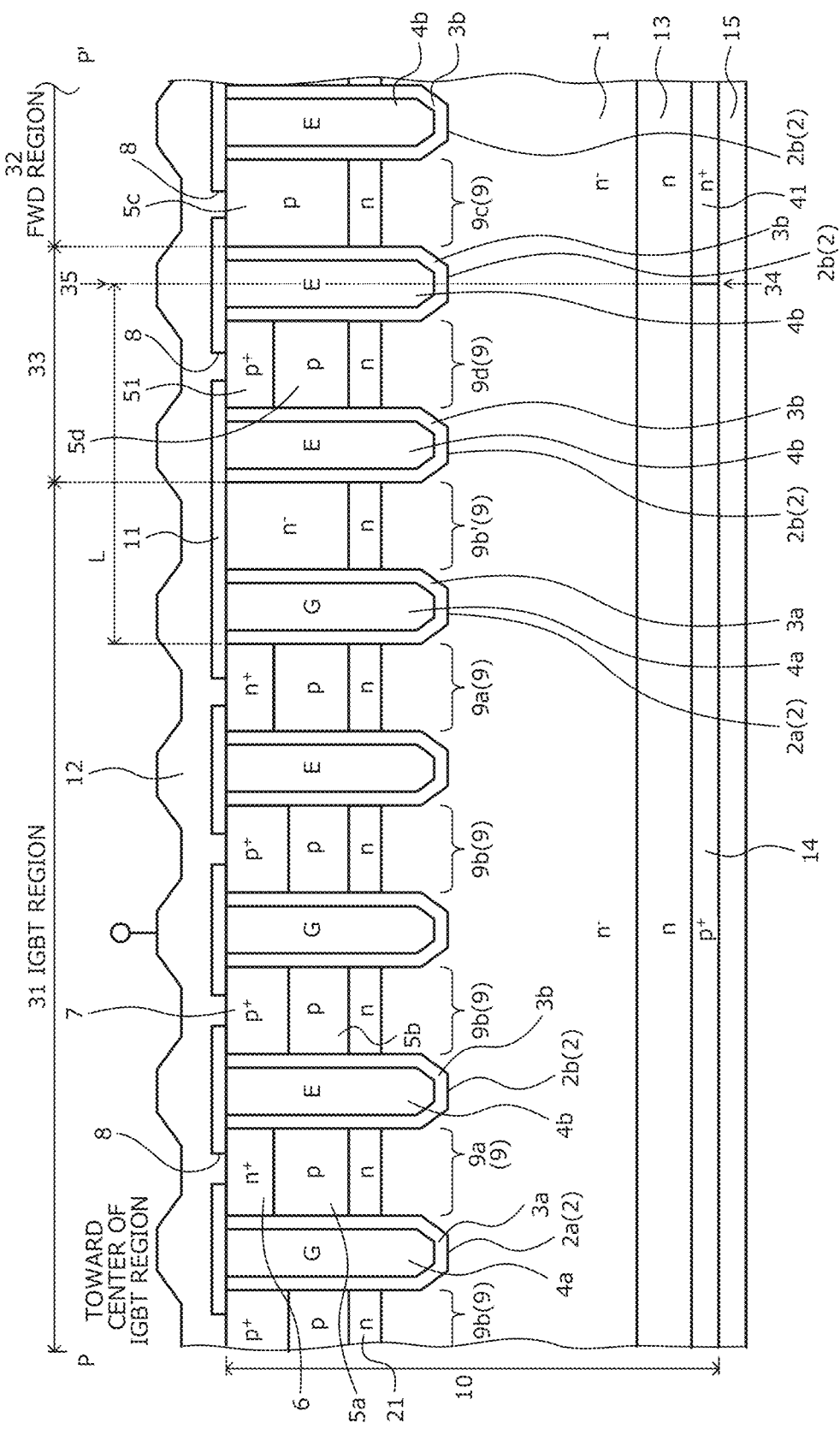
FIG. 25 is a cross-sectional view at cutting line P-P' in FIG. 22.

FIG. 25 is a cross-sectional view at cutting line P-P' in FIG. 22. The semiconductor device according to the seventh embodiment is a reverse conducting IGBT (RC-IGBT) to which the semiconductor device according to the first embodiment is applied.

In particular, as depicted in FIGS. 22, 23, 24, and 25, in the active region, on a single semiconductor substrate 10, an IGBT region 31 constituting an operating region of an IGBT and a FWD region 32 constituting an operating region of a free wheeling diode (FWD) are provided in parallel along a direction parallel to the front surface of the semiconductor substrate 10. In the IGBT region 31, similarly to the first embodiment, a trench gate IGBT having the gate electrode 4a at the gate potential G and the dummy gate electrode 4b at the emitter electric potential E is provided.

In other words, in the IGBT region 31, similarly to the first embodiment, the gate trenches 2a and the dummy trenches 2b are disposed by a predetermined repeating pattern; and the first mesa regions 9a functioning as MOS gates and the second mesa regions 9b not functioning as MOS gates are disposed by a predetermined repeating pattern. In the IGBT region 31, at a side thereof nearest the FWD region 32, a second mesa region 9b (hereinafter, indicated by 9b') is disposed.

The second mesa region 9b' at the side of the IGBT region 31 nearest the FWD region 32 is in contact with the gate trench 2a toward a center of the IGBT region 31. In other words, the trench 2 at the side of the IGBT region 31 nearest the FWD region 32 is a gate trench 2a. The second mesa region 9b' at the side of the IGBT region 31 nearest the FWD region 32' is a region between the gate trench 2a at the side of the IGBT region 31 nearest the FWD region 32 and a dummy trench 2b at a side of a boundary region 33 described hereinafter, the side thereof nearest the IGBT region 31.

In the IGBT region 31, similarly to the fourth embodiment, the accumulation layer 21 may be disposed. Cutting lines O1-O1', O2-O2', P-P' in FIGS. 23 to 25 are parallel cutting lines along the second direction Y. A cross-sectional view of the IGBT region 31 at cutting line O1-O1' passing through the n$^+$-type emitter region 6 of the first mesa region 9a and the n$^-$-type drift layer 1 of the second mesa regions 9b is similar to that in which the accumulation layer 21 is disposed in FIG. 2A of the first embodiment.

A cross-sectional view (FIG. 24) of the IGBT region 31 at cutting line O2-O2' passing through the p$^+$-type contact regions 7 of the first mesa regions 9a and the n$^-$-type drift layer 1 of the second mesa regions 9b is similar to that in which the accumulation layer 21 is disposed in FIG. 2B of the first embodiment. A cross-sectional view of the IGBT region 31 at cutting line P-P' passing through the n$^+$-type emitter regions 6 of the first mesa regions 9a and the p$^+$-type contact regions 7 of the second mesa regions 9b is similar to that in which the accumulation layer 21 is disposed in FIG. 3 of the first embodiment.

In the FWD region 32, the FWD is provided connected in reverse parallel with the IGBT of the IGBT region 31. The FWD of the FWD region 32 is a diode formed by pn junctions of a p-type anode region 5c with the n$^-$-type drift layer 1 and an n$^+$-type cathode region 41. Further, in the FWD region 32, similarly to the IGBT region 31, the trenches 2 are disposed in a striped layout extending along the first direction X, in parallel to the trenches 2 of the IGBT region 31.

The trenches 2 provided in the FWD region 32 are all dummy trenches 2b. The dummy trenches 2b of the FWD region 32, similarly to the dummy trenches 2b of the IGBT region 31, have provided therein the dummy gate electrode 4b, via the dummy gate insulating film 3b. The dummy gate electrodes 4b of the FWD region 32, similarly to the dummy gate electrodes 4b of the IGBT region 31, are electrically connected with the emitter electric potential E at a non-depicted part. The dummy gate electrodes 4b of the FWD region 32 may be in contact with the emitter electrode 12.

The p-type anode region 5c, in a region (hereinafter, third mesa region) 9c sandwiched between the dummy trenches 2b of the FWD region 32, is provided in a surface region (the surface layer at the front surface of the semiconductor substrate 10) overall. The p-type anode region 5c is exposed at the contact hole 8 of the third mesa region 9c. The contact hole 8 of the third mesa region 9c, for example, is formed at a central part of the third mesa region 9c and has a length substantially equal to that of the trenches 2, along the first direction X.

A depth of the p-type anode region 5c, for example, is equal to that of the first and the second p-type base regions 5a, 5b of the IGBT region 31. The p-type anode region 5c is in contact with the emitter electrode 12 via the contact hole 8 of the third mesa region 9c, and is electrically connected with the emitter electrode 12. In other words, the emitter electrode 12 doubles as an anode electrode. At a position deeper from the substrate front surface than is the p-type anode region 5c, for example, the accumulation layer 21 may be provided in contact with the p-type anode region 5c and may have a substantially uniform thickness across the FWD region 32 overall.

The $n^+$-type cathode region 41, in the FWD region 32, is provided in a surface layer at the rear surface of the semiconductor substrate 10. The $n^+$-type cathode region 41 is provided in contact with the $p^+$-type contact layer 14, along a direction parallel to the rear surface of the semiconductor substrate 10. A boundary of the $n^+$-type cathode region 41 and the $p^+$-type contact layer 14 is positioned directly beneath (collector side across the $n^-$-type drift layer 1 and the n-type buffer layer 13) the dummy trench 2b on a side of the boundary region 33 described hereinafter, the side thereof nearest the FWD region 32.

A thickness of the $n^+$-type cathode region 41, for example, may be equal to that of the $p^+$-type contact layer 14. The n-type buffer layer 13 spans the IGBT region 31 and the FWD region 32, through the boundary region 33. The n-type buffer layer 13 is disposed in contact with the $n^+$-type cathode region 41, at a position deeper from the rear surface of the semiconductor substrate 10 than is the $n^+$-type cathode region 41. A contact electrode 15 is provided at the rear surface of the semiconductor substrate 10 overall, and is in contact with the $p^+$-type contact layer 14 and the $n^+$-type cathode region 41. In other words, the contact electrode 15 doubles as a cathode electrode.

In a region (hereinafter, boundary region) 33 between the IGBT region 31 and the FWD region 32, two adjacent dummy trenches 2b sandwiching one mesa region (hereinafter, boundary mesa region) 9d are disposed. In other words, of the two dummy trenches 2b sandwiching the boundary mesa region 9d, one dummy trench 2b is in contact with the second mesa region 9b' at the side of the IGBT region 31 nearest the FWD region 32' and the other dummy trench 2b is in contact with the third mesa region 9c at a side of the FWD region 32, the side nearest the IGBT region 31.

The dummy trenches 2b of the boundary region 33, similarly to the dummy trenches 2b of the IGBT region 31, have provided therein the dummy gate electrode 4b via the dummy gate insulating film 3b. The dummy gate electrodes 4b of the boundary region 33, similarly to the dummy gate electrodes 4b of the IGBT region 31, are electrically connected with the emitter electric potential E at a non-depicted part. The dummy gate electrodes 4b of the boundary region 33 may be in contact with the emitter electrode 12.

In the boundary mesa region 9d, in a surface region (the surface layer at the front surface of the semiconductor substrate 10) overall, a third p-type base region 5d is provided. A depth of the third p-type base region 5d, for example, is equal to the depths of the first and the second p-type base regions 5a, 5b of the IGBT region 31. At a position deeper from the substrate front surface than is the third p-type base region 5d, the accumulation layer 21 may be provided in contact with the third p-type base region 5d.

In the third p-type base region 5d, a $p^+$-type contact region 51 is selectively provided in a surface region of the third p-type base region 5d overall. In other words, the $p^+$-type contact region 51 of the boundary mesa region 9d is provided extending to the dummy trenches 2b positioned at each side of the $p^+$-type contact region 51 along the second direction Y. The $p^+$-type contact region 51 is exposed at the contact hole 8 of the boundary mesa region 9d, is in contact with the emitter electrode 12 via the contact hole 8, and is electrically connected with the emitter electrode 12.

The contact hole of the boundary mesa region 9d, for example, is formed at a central part of the boundary mesa region 9d and has a length that is substantially equal to that of the dummy trenches 2b along the first direction X. A boundary 34 of the $n^+$-type cathode region 41 and the $p^+$-type contact layer 14, as described above, is positioned directly beneath the dummy trench 2b at the side of the boundary region 33 nearest the FWD region 32. Therefore, the boundary mesa region 9d opposes the $p^+$-type contact layer 14 in a depth direction Z across the $n^-$-type drift layer 1 and the n-type buffer layer 13, the $p^+$-type contact layer 14 extending from the IGBT region 31 to the boundary region 33.

A distance L from a position 35 where a position of the boundary 34 of the $n^+$-type cathode region 41 and the $p^+$-type contact layer 14 is projected on the front surface of the semiconductor substrate 10, to the $n^+$-type emitter region 6 on a side of the IGBT region 31, the side nearest the FWD region 32, is at least equal to a sum of a width w1 of the boundary mesa region 9d, a width w2 of the second mesa region 9b' at the side of the IGBT region 31 nearest the FWD region 32', and widths w3, w4 of the trenches 2 on each side of the second mesa region 9b'.

Figure 26:
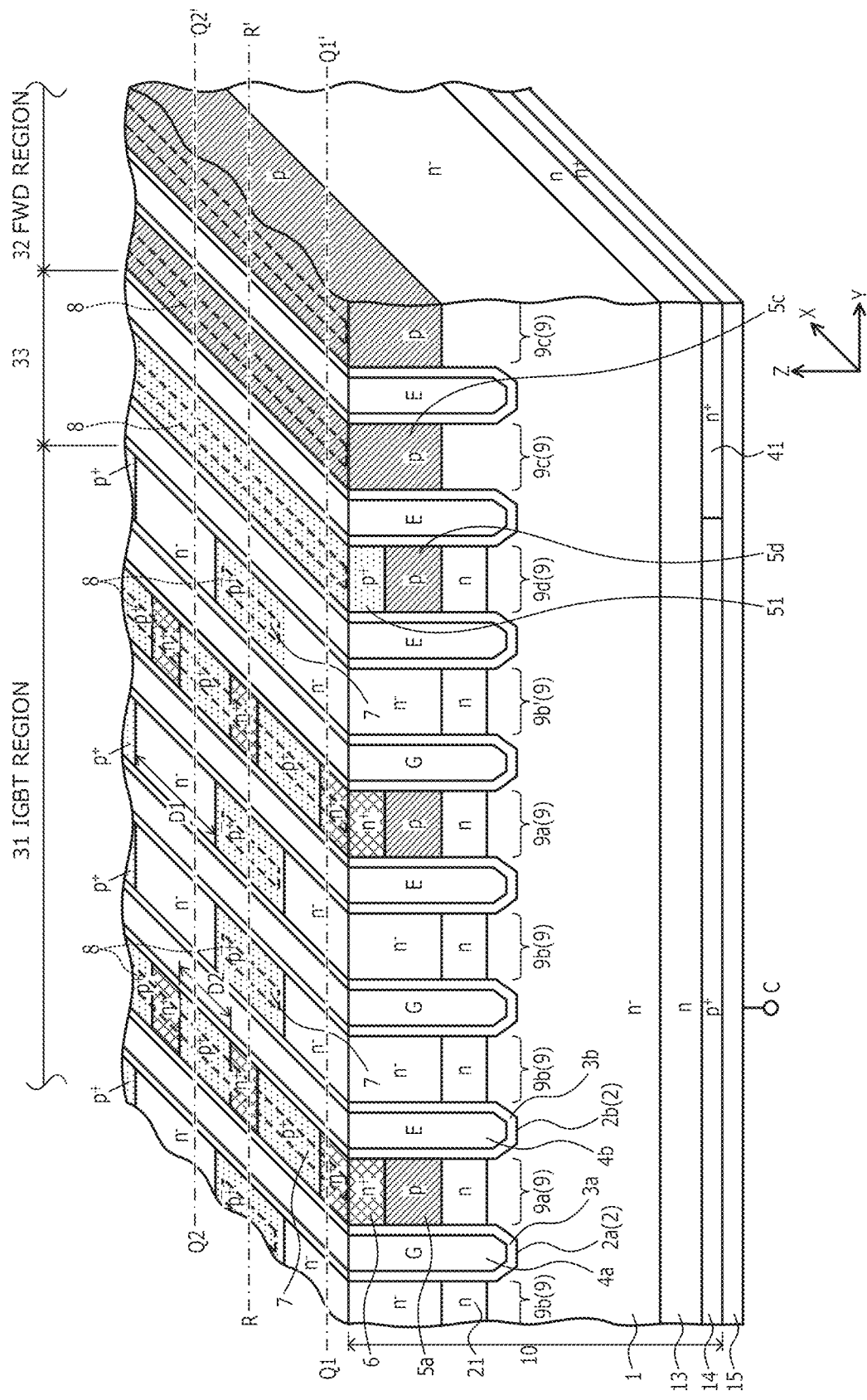
FIG. 26 is a perspective view of a structure of another example of the semiconductor device according to the seventh embodiment.
Figure 27:
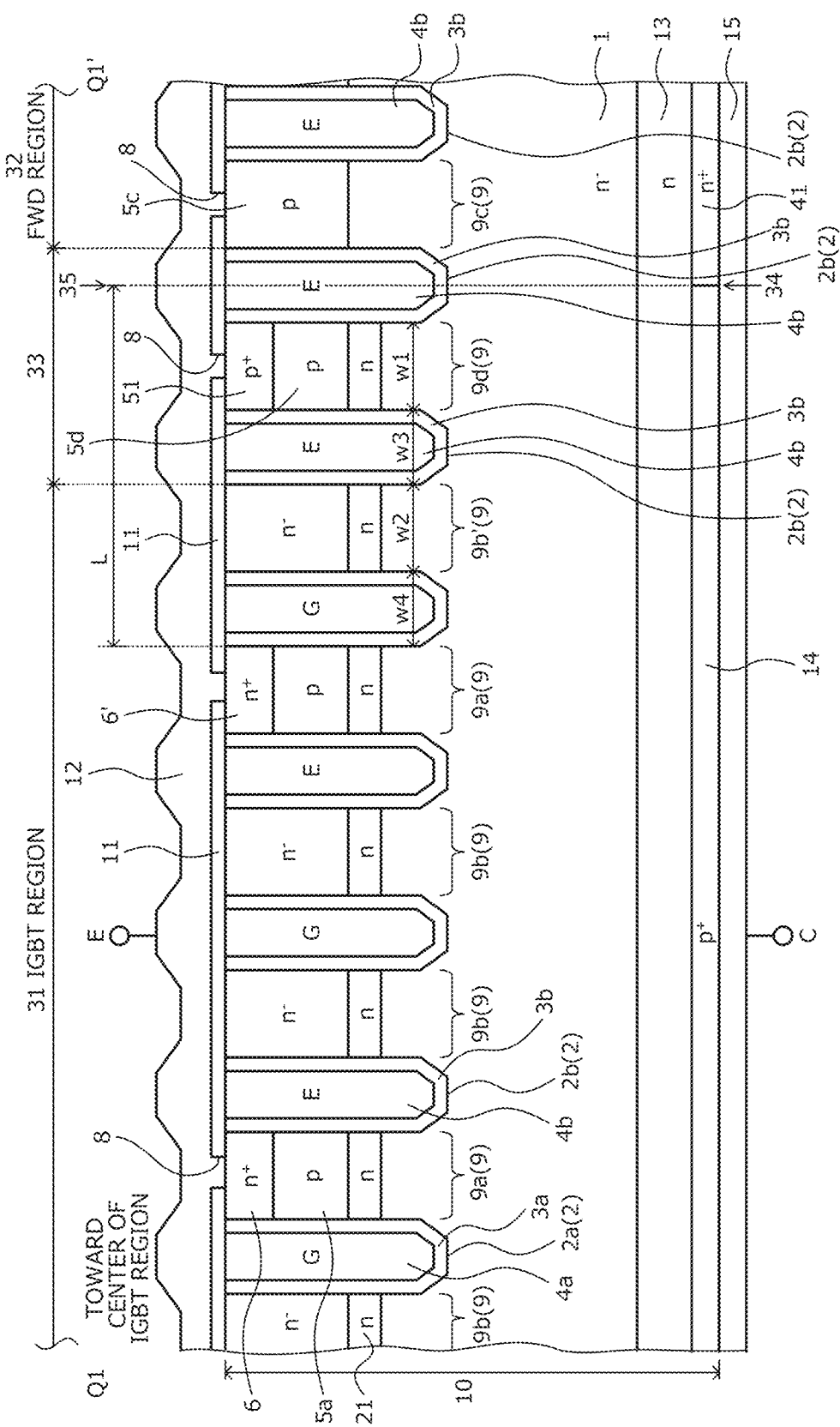
FIG. 27 is a cross-sectional view at cutting line Q1-Q1' in FIG. 26.
Figure 28:
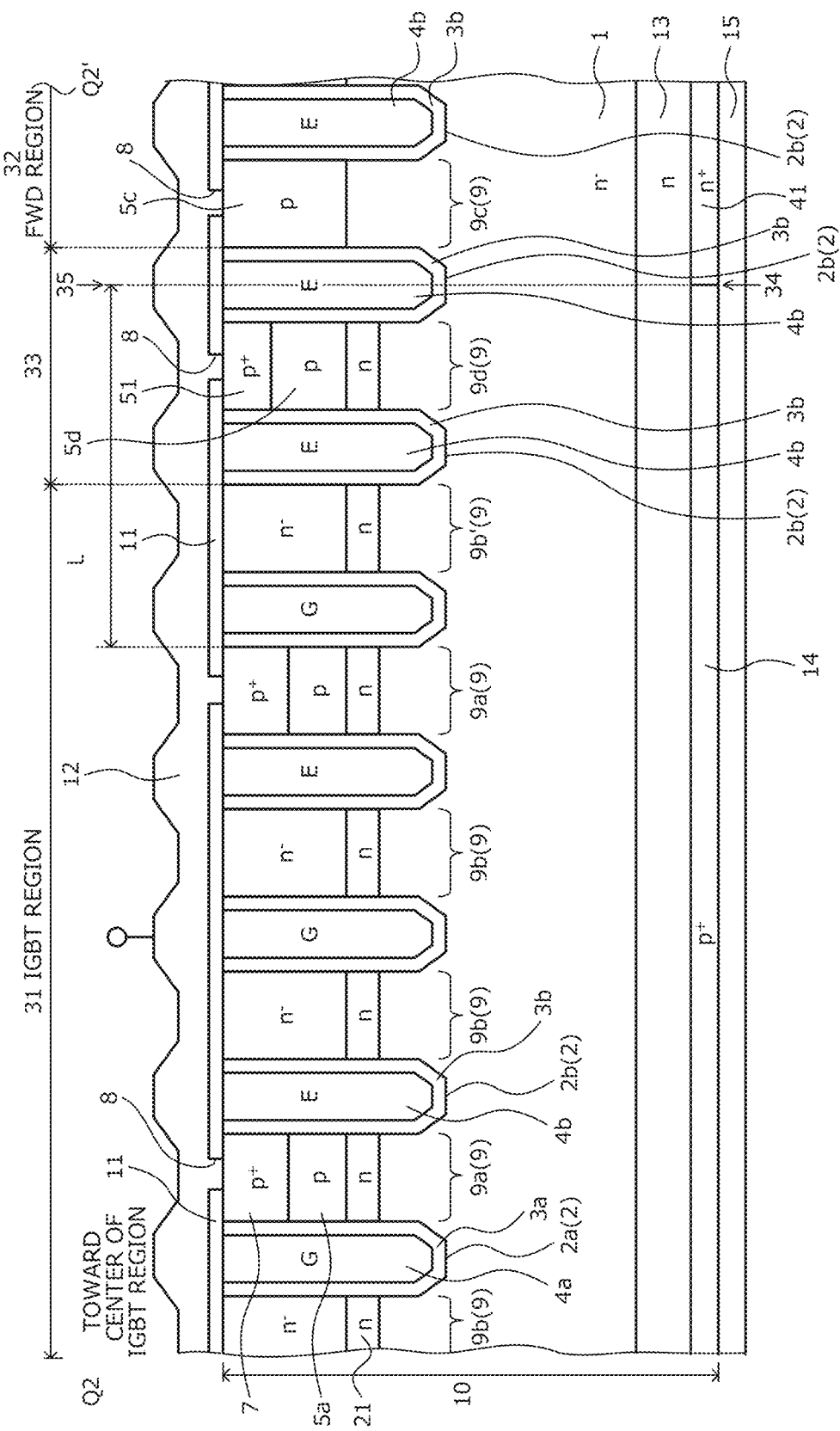
FIG. 28 is a cross-sectional view at cutting line Q2-Q2' in FIG. 26.
Figure 29:
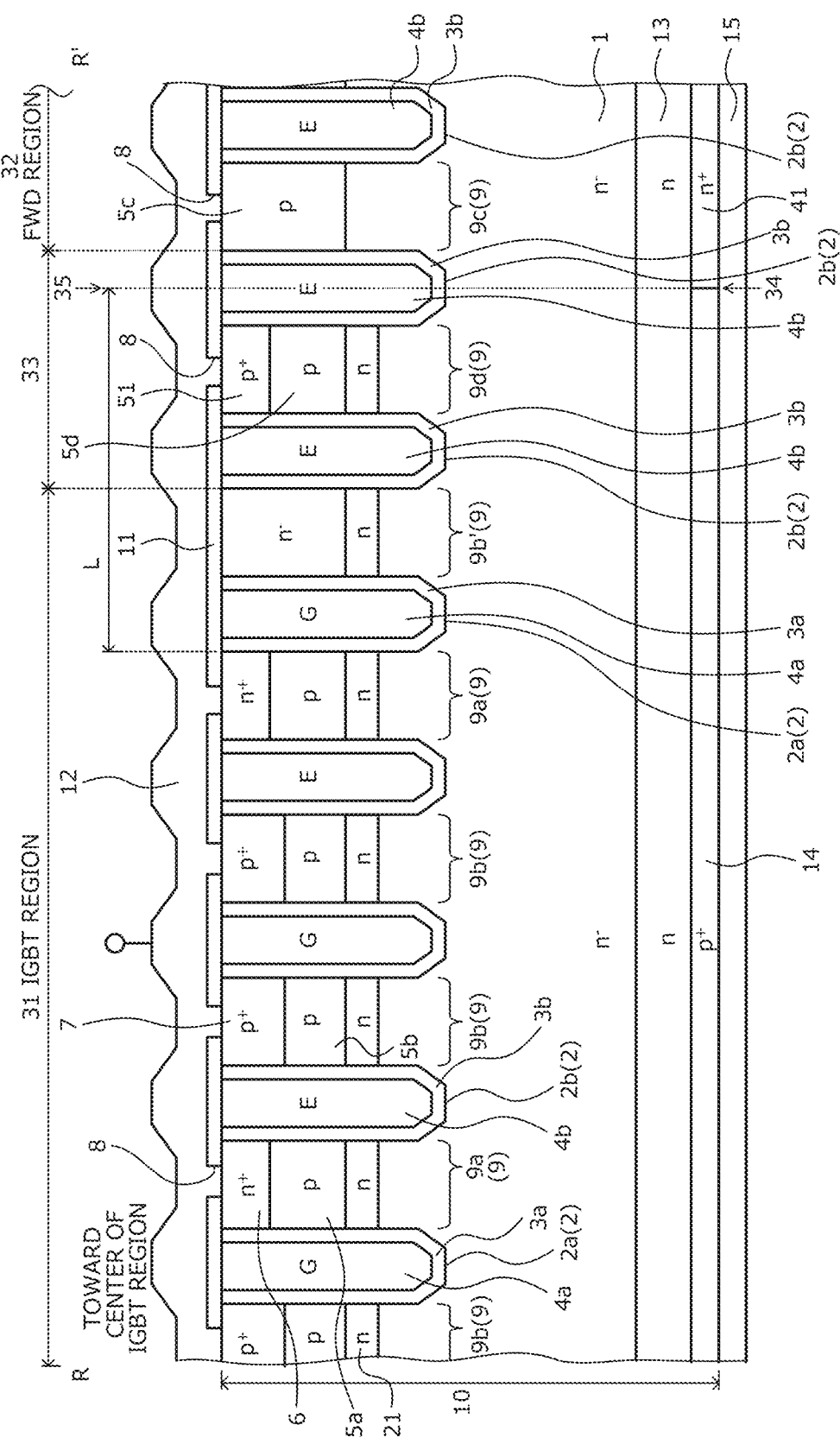
FIG. 29 is a cross-sectional view at cutting line R-R' in FIG. 26.

Another example of the semiconductor device according to the seventh embodiment will be described. FIG. 26 is a perspective view of a structure of another example of the semiconductor device according to the seventh embodiment. FIG. 27 is a cross-sectional view at cutting line Q1-Q1' in FIG. 26. FIG. 28 is a cross-sectional view at cutting line Q2-Q2' in FIG. 26. FIG. 29 is a cross-sectional view at cutting line R-R' in FIG. 26.

The example of the semiconductor device according to the seventh embodiment depicted in FIG. 26 differs from the semiconductor device according to the seventh embodiment depicted in FIG. 22 in that the accumulation layer 21 is not provided in the FWD region 32. In other words, the accumulation layer 21 is provided only in the IGBT region 31 and the boundary region 33. In the example of the semiconductor device according to the seventh embodiment depicted in FIG. 26, at the time of reverse recovery of the FWD of the FWD region 32, holes may be easily pulled from the front surface side of the semiconductor substrate 10.

In the IGBT region 31, a trench gate IGBT having any one of the configurations of the second to the fifth embodiments may be provided.

As described, according to the seventh embodiment, even with application to a RC-IGBT, effects of the first to the sixth embodiments may be obtained.

In the embodiments of the present invention, various modifications within a range not departing from the spirit of the invention are possible. For example, dimensions, impurity concentrations, etc. of constituent parts may be variously changed according to required specifications. Further, in the embodiments, as an example, while a case has been described in which the first and the second mesa regions are disposed repeating regularly along the second direction, the arrangement of the first and the second mesa regions may be variously changed within a range not departing from the spirit of the invention. The present invention is similarly implemented when the conductivity types (n-type, p-type) are reversed.

According to the embodiments of the present invention, at the time of turn ON, at a part of the second mesa regions where the p-type base region (second semiconductor region) is not disposed, high minority carrier density is maintained. As a result, compared to a case where the p-type base region is provided in a surface region of the active region overall like the conventional structure, at the time of turn ON, resistance near the substrate front surface decreases, enabling the ON resistance to be reduced.

The semiconductor device according the embodiments of the present invention achieves an effect in that the ON voltage maybe reduced.

As described, the semiconductor device according to the embodiments of the present invention are useful for semiconductor devices used in power supply devices of various types of industrial machines, electric vehicles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a plurality of trenches reaching a predetermined depth from a front surface of a semiconductor substrate of a first conductivity type, the plurality of trenches being disposed in a striped layout along a first direction parallel to the front surface of the semiconductor substrate;
   a plurality of gate electrodes provided in the plurality of trenches, via a plurality of gate insulating films;
   a first gate electrode of the plurality of gate electrodes and contributing to element control;
   a second gate electrode of the plurality of the gate electrodes other than the first gate electrode;
   a first trench of the plurality of trenches and in which the first gate electrode is provided;
   a second trench of the plurality of trenches and in which the second gate electrode is provided;
   a plurality of mesa regions between adjacent trenches of the plurality of trenches;
   a first semiconductor region of a second conductivity type provided in a first mesa region of the plurality of mesa regions, extending in the first direction along an entire length of an active region of the semiconductor substrate, at a depth shallower from the front surface of the semiconductor substrate than is the plurality of trenches;
   a second semiconductor region of the second conductivity type provided in a second mesa region of the plurality of mesa regions other than the first mesa region, the second semiconductor region being provided at a depth shallower from the front surface of the semiconductor substrate than is the plurality of trenches, at a predetermined interval along the first direction;
   a third semiconductor region of the first conductivity type provided in the first semiconductor region at a predetermined interval along the first direction;
   a fourth semiconductor region of the second conductivity type provided at a rear surface of the semiconductor substrate;
   a first electrode electrically connected with the first semiconductor region, the second semiconductor region, the third semiconductor region and the second gate electrode; and
   a second electrode electrically connected with the fourth semiconductor region, wherein
   the first trench is at least one of the adjacent trenches on each side of the first mesa region, and
   the second trench is at least one of the adjacent trenches on each side of the second mesa region.

2. The semiconductor device according to claim 1, wherein
   the second mesa region opposes an adjacent second mesa region, across the first trench in a second direction orthogonal to the first direction.

3. The semiconductor device according to claim 1, wherein
   the second mesa region opposes an adjacent second mesa region, across the second trench in a second direction orthogonal to the first direction.

4. The semiconductor device according to claim 1, wherein
   the first mesa region is sandwiched by the first trench and an adjacent first trench.

5. The semiconductor device according to claim 1, further comprising
   a fifth semiconductor region of the first conductivity type provided in the first mesa region overall, at a position deeper from the front surface of the semiconductor substrate than is the first semiconductor region, the fifth semiconductor region being in contact with the first semiconductor region and having an impurity concentration higher than that of the semiconductor substrate.

6. The semiconductor device according to claim 5, wherein
   the fifth semiconductor region is further provided in the second mesa region overall, at a position deeper from the front surface of the semiconductor substrate than is the second semiconductor region, the fifth semiconductor region being in contact with the second semiconductor region.

7. The semiconductor device according to claim 5, wherein
   the fifth semiconductor region is further provided in a region opposing the second semiconductor region in a depth direction, the fifth semiconductor region being provided at a position deeper from the front surface of the semiconductor substrate than is the second semiconductor region and provided being in contact with the second semiconductor region.

8. The semiconductor device according to claim 1, further comprising:
- a third trench of the plurality of trenches and in which the second gate electrode is provided;
- a third mesa region of the plurality of mesa regions and between the adjacent trenches that include at least the third trench;
- a sixth semiconductor region of the second conductivity type provided in the third mesa region overall, at a depth shallower from the front surface of the semiconductor substrate than is the plurality of trenches;
- a seventh semiconductor region of the first conductivity type provided adjacent to the fourth semiconductor region along a direction parallel to the rear surface of the semiconductor substrate, the seventh semiconductor region being in contact with the fourth semiconductor region and opposing the sixth semiconductor region in a depth direction, the seventh semiconductor region having an impurity concentration higher than that of the semiconductor substrate;
- a first element region in which the first trench and the second trench are disposed;
- a second element region in which the third trench is disposed;
- two fourth trenches of the plurality of trenches and in which the second gate electrode is provided, the two fourth trenches being disposed in a boundary region of the first element region and the second element region;
- a fourth mesa region of the plurality of mesa regions and sandwiched by the two fourth trenches;
- an eighth semiconductor region of the second conductivity type provided in the fourth mesa region overall, at a depth shallower from the front surface of the semiconductor substrate than is the plurality of trenches; and
- a ninth semiconductor region of the second conductivity type provided in the eighth semiconductor region overall, at a depth shallower from the front surface of the semiconductor substrate than is the eighth semiconductor region, the ninth semiconductor region having an impurity concentration higher than that of the eighth semiconductor region, wherein the sixth semiconductor region and the ninth semiconductor region are electrically connected with the first electrode, the seventh semiconductor region is electrically connected with the second electrode, of the two fourth trenches, a fourth trench nearest the first element region is adjacent to the first trench, and the second mesa region is disposed between the fourth trench nearest the first element region and the first trench adjacent thereto, and of the two fourth trenches, a fourth trench nearest the second element region is adjacent to the third trench, and the third mesa region is disposed between the fourth trench nearest the second element region and the third trench adjacent thereto.

9. The semiconductor device according to claim 8, wherein
- a boundary of the fourth semiconductor region and the seventh semiconductor region opposes in the depth direction, the fourth trench nearest the second element region of the two fourth trenches.

10. The semiconductor device according to claim 8, wherein
- a distance from the boundary of the fourth semiconductor region and the seventh semiconductor region, to the third semiconductor region disposed nearest the boundary region is at least a sum of a width of the eighth semiconductor region, a width of the second mesa region in the first element region and nearest the second element region, and widths of the adjacent trenches on each side of the second mesa region.

11. The semiconductor device according to claim 1, further comprising:
- a fifth semiconductor region of the second conductivity type selectively provided between adjacent third semiconductor regions, in the first semiconductor region, along the first direction, the fifth semiconductor region being in contact with each of the adjacent third semiconductor regions on opposite sides of the fifth semiconductor region, along the first direction.

12. The semiconductor device according to claim 11, wherein a depth of the fifth semiconductor region is deeper than a depth of the third semiconductor region.

13. The semiconductor device according to claim 1, further comprising:
- a fifth semiconductor region of the second conductivity type provided at a central part of the second semiconductor region along the first direction, having a rectangular shape in a planar view.

14. The semiconductor device according to claim 13, wherein a depth of the fifth semiconductor region is deeper than a depth of the third semiconductor region.

15. The semiconductor device according to claim 1, wherein a surface of the first mesa region is separated from a surface of the second mesa region by the first or second trench.

16. A semiconductor device, comprising:
- a plurality of trenches reaching a predetermined depth from a front surface of a semiconductor substrate of a first conductivity type, the plurality of trenches being disposed in a striped layout along a first direction parallel to the front surface of the semiconductor substrate;
- a plurality of gate electrodes provided in the plurality of trenches, via a plurality of gate insulating films;
- a first gate electrode of the plurality of gate electrodes and contributing to element control;
- a second gate electrode of the plurality of the gate electrodes other than the first gate electrode;
- a first trench of the plurality of trenches and in which the first gate electrode is provided;
- a second trench of the plurality of trenches and in which the second gate electrode is provided;
- a plurality of mesa regions between adjacent trenches of the plurality of trenches;
- a first semiconductor region of a second conductivity type provided in a first mesa region of the plurality of mesa regions, at a depth shallower from the front surface of the semiconductor substrate than is the plurality of trenches;
- a second semiconductor region of the second conductivity type provided in a second mesa region of the plurality of mesa regions other than the first mesa region, the second semiconductor region being provided at a depth shallower from the front surface of the semiconductor substrate than is the plurality of trenches, at a predetermined interval along the first direction;
- a third semiconductor region of the first conductivity type provided in the first semiconductor region at a predetermined interval along the first direction;

a fourth semiconductor region of the second conductivity type provided at a rear surface of the semiconductor substrate;
a fifth semiconductor region of the second conductivity type provided at a central part of the second semiconductor region along the first direction;
a first electrode electrically connected with the first semiconductor region, the second semiconductor region, the third semiconductor region and the second gate electrode; and
a second electrode electrically connected with the fourth semiconductor region,
wherein
the first trench is at least one of the adjacent trenches on each side of the first mesa region, and
the second trench is at least one of the adjacent trenches on each side of the second mesa region,
the third semiconductor region is further provided at the central part of the second semiconductor region along the first direction and has a rectangular shape in a planar view, opposite sides of the third semiconductor region provided at the central part of the second semiconductor region being in contact with the fifth semiconductor region, along the first direction, and
the adjacent trenches on each side of the second mesa region are the first trench and the second trench, respectively.

17. A semiconductor device, comprising:
a plurality of trenches reaching a predetermined depth from a front surface of a semiconductor substrate of a first conductivity type, the plurality of trenches being disposed in a striped layout along a first direction parallel to the front surface of the semiconductor substrate;
a plurality of gate electrodes provided in the plurality of trenches, via a plurality of gate insulating films;
a first gate electrode of the plurality of gate electrodes and contributing to element control;
a second gate electrode of the plurality of the gate electrodes other than the first gate electrode;
a first trench of the plurality of trenches and in which the first gate electrode is provided;
a second trench of the plurality of trenches and in which the second gate electrode is provided;
a plurality of mesa regions between adjacent trenches of the plurality of trenches;
a first semiconductor region of a second conductivity type provided in a first mesa region of the plurality of mesa regions, at a depth shallower from the front surface of the semiconductor substrate than is the plurality of trenches;
a second semiconductor region of the second conductivity type provided in a second mesa region of the plurality of mesa regions other than the first mesa region, the second semiconductor region being provided at a depth shallower from the front surface of the semiconductor substrate than is the plurality of trenches, at a predetermined interval along the first direction;
a third semiconductor region of the first conductivity type provided in the first semiconductor region at a predetermined interval along the first direction;
a fourth semiconductor region of the second conductivity type provided at a rear surface of the semiconductor substrate;
a fifth semiconductor region of the first conductivity type provided in the first mesa region overall, at a position deeper from the front surface of the semiconductor substrate than is the first semiconductor region, the fifth semiconductor region being in contact with the first semiconductor region and having an impurity concentration higher than that of the semiconductor substrate;
a first electrode electrically connected with the first semiconductor region, the second semiconductor region, the third semiconductor region and the second gate electrode; and
a second electrode electrically connected with the fourth semiconductor region, wherein
the first trench is at least one of the adjacent trenches on each side of the first mesa region, and
the second trench is at least one of the adjacent trenches on each side of the second mesa region.

18. The semiconductor device according to claim 17, wherein
the fifth semiconductor region is further provided in the second mesa region overall, at a position deeper from the front surface of the semiconductor substrate than is the second semiconductor region, the fifth semiconductor region being in contact with the second semiconductor region.

19. The semiconductor device according to claim 17, wherein
the fifth semiconductor region is further provided in a region opposing the second semiconductor region in a depth direction, the fifth semiconductor region being provided at a position deeper from the front surface of the semiconductor substrate than is the second semiconductor region and provided being in contact with the second semiconductor region.

20. The semiconductor device according to claim 17, wherein
the third semiconductor region is further provided in the second semiconductor region, and
the adjacent trenches on each side of the second mesa region are the first trench and the second trench, respectively.

* * * * *